United States Patent
Moon et al.

(10) Patent No.: US 11,950,463 B2
(45) Date of Patent: Apr. 2, 2024

(54) SUB-POWER LINES IN NON-DISPLAY AREA AND DISPLAY DEVICE INCLUDING THE SAME

(71) Applicant: Samsung Display Co., LTD., Yongin-si (KR)

(72) Inventors: Sang Ho Moon, Cheonan-si (KR); Chun Gi You, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 296 days.

(21) Appl. No.: 17/229,962

(22) Filed: Apr. 14, 2021

(65) Prior Publication Data
US 2022/0052143 A1  Feb. 17, 2022

(30) Foreign Application Priority Data
Aug. 11, 2020  (KR) .................. 10-2020-0100654

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .......... H10K 59/131; H10K 59/1201
See application file for complete search history.

(56) References Cited

U.S. PATENT DOCUMENTS

| | | | |
|---|---|---|---|
| 2012/0001885 A1* | 1/2012 | Kang | H10K 59/1795 445/24 |
| 2018/0158895 A1 | 6/2018 | Lee et al. | |
| 2020/0135835 A1 | 4/2020 | Seo et al. | |

FOREIGN PATENT DOCUMENTS

| | | |
|---|---|---|
| KR | 10-0615212 B1 | 8/2006 |
| KR | 10-1769586 B1 | 8/2017 |
| KR | 1020190035995 A | 4/2019 |
| KR | 1020200028567 A | 3/2020 |

OTHER PUBLICATIONS

European Search Report For European Patent Application No. 21188995.1 dated Jan. 31, 2022.

* cited by examiner

*Primary Examiner* — Lex H Malsawma
(74) *Attorney, Agent, or Firm* — CANTOR COLBURN LLP

(57) ABSTRACT

A display device includes a substrate including a display area and a non-display area, a first power supply line in the non-display area and applying a first supply voltage to the display area, and a driving voltage line which is in the display area and connects the display area to the first power supply line. The first power supply line includes a first sub-power supply line, and a second sub-power supply line which is on the first sub-power supply line. The second sub-power supply line includes a same material as the driving voltage line.

22 Claims, 37 Drawing Sheets

LEL : 171,172,173
PX : DTFT,C1,LEL

LEL : 171,172,173
PX : DTFT,C1,LEL

SUB-POWER LINES IN NON-DISPLAY AREA AND DISPLAY DEVICE INCLUDING THE SAME

This application claims priority to Korean Patent Application No. 10-2020-0100654 filed on Aug. 11, 2020, and all the benefits accruing therefrom under 35 U.S.C. § 119, the content of which in its entirety is herein incorporated by reference.

BACKGROUND

1. Field

The disclosure relates to a display device and a method for providing or fabricating the same.

2. Description of the Related Art

As the information-oriented society evolves, various demands for display devices are ever increasing. For example, display devices are being employed by a variety of electronic devices such as smart phones, digital cameras, laptop computers, navigation devices and smart televisions. Display devices may be flat panel display devices such as a liquid-crystal display device, a field emission display device and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

In order to widen a display area in which pixels displaying images are arranged, a bezel area or a non-display area other than the display area is minimized.

SUMMARY

Embodiments of the invention provide a display device which suppresses or prevents luminance of pixels from becoming non-uniform.

Embodiments of the invention also provide a method of providing or fabricating a display device which suppresses or prevents the luminance of the pixels from becoming non-uniform.

An embodiment of the invention provides a display device including a substrate including a display area and a non-display area, a first power supply line in the non-display area and applying a first supply voltage, and a driving voltage line in the display area and connected to the first power supply line. The first power supply line includes a first sub-power supply line, and a second sub-power supply line which is on the first sub-power supply line. The second sub-power supply line includes a same material as the driving voltage line.

The driving voltage line may protrude from the second sub-power supply line.

The second sub-power supply line may be in contact with the first sub-power supply line.

The first power supply line may extend in a first direction. A width of a second sub-power supply line along the first direction may be greater than a width of the first sub-power supply line along the first direction.

The display device may further include an insulating layer on the substrate and under the first sub-power supply line and the driving voltage line.

A thickness of the insulating layer overlapping the first sub-power supply line along a thickness direction of the substrate may be greater than a thickness of the insulating layer overlapping the driving voltage line along the thickness direction of the substrate.

A difference between the thickness of the insulating layer overlapping the first sub-power supply line along the thickness direction of the substrate and the thickness of the insulating layer overlapping the driving voltage line along the thickness direction of the substrate may range from about 700 angstroms (Å) to 1,200 Å.

A thickness of the insulating layer overlapping the first sub-power supply line along a thickness direction of the substrate may be greater than a thickness of the insulating layer overlapping not with the first sub-power supply line but with the second sub-power supply line along the thickness direction of the substrate.

The display device may further include display pads in the non-display area, a first power supply pad line in the non-display area and connected to a display pad of the display pads, and a power supply bridge in the non-display area and connected to the first power supply line and the first power supply pad line.

The display device may further include a planarization layer on the first power supply line and the first power supply pad line. The power supply bridge may be disposed on the planarization layer.

The power supply bridge may be connected to the second sub-power supply line through a first power connection contact hole in the planarization layer.

The first power supply pad line may include a first sub-power supply pad line, and a second sub-power supply pad line which is on the first sub-power supply pad line. The second sub-power supply pad line may include a same material as the driving voltage line.

The first power supply line, the power supply bridge and the first power supply pad line may be arranged along a first direction. A width of the second sub-power supply pad line along the first direction may be greater than a width of the first sub-power supply pad line along the first direction.

The power supply bridge may be connected to the second sub-power supply pad line through a second power connection contact hole in the planarization layer.

The display device may further include sub-pixels in the display area. Each of the sub-pixels may include a pixel electrode on the planarization layer, an emissive layer on the pixel electrode, and a common electrode on the emissive layer. The power supply bridge may include a same material as the pixel electrode.

The display device may further include a demux transistor connected to at least one data line among data lines. The power supply bridge may overlap the demux transistor.

The display device may further include a second power supply line in the non-display area and applying a second supply voltage different from the first supply voltage.

An embodiment of the invention provides a display device including a substrate including a display area and a non-display area, an insulating layer on the substrate, a driving voltage line on the insulating layer and in the display area, and a first power supply line on the insulating layer and in the non-display area. The first power supply line includes a first sub-power supply line, and a second sub-power supply line on the first sub-power supply line. A thickness of the insulating layer overlapping the first sub-power supply line along a thickness direction of the substrate is greater than a thickness of the insulating layer overlapping the driving voltage line along the thickness direction of the substrate.

A difference between the thickness of the insulating layer overlapping the first sub-power supply line along the thickness direction of the substrate and the thickness of the insulating layer overlapping the driving voltage line along the thickness direction of the substrate may range from about 700 Å to about 1,200 Å.

A thickness of the insulating layer overlapping the first sub-power supply line along a thickness direction of the substrate may be greater than a thickness of the insulating layer overlapping not with the first sub-power supply line but with the second sub-power supply line along the thickness direction of the substrate.

The second sub-power supply line may include a same material as the driving voltage line.

The second sub-power supply line may be in contact with the first sub-power supply line.

An embodiment of the invention provides a method of fabricating a display device, the method including providing an active layer, a source electrode and a drain electrode of a thin-film transistor on a substrate, providing a gate insulating layer on the active layer, the source electrode and the drain electrode, and providing a gate electrode of the thin-film transistor on the gate insulating layer, providing an insulating layer on the gate electrode and providing a first sub-power supply line on the insulating layer, simultaneously providing a driving voltage line on the insulating layer and a second sub-power supply line on the first sub-power supply line, providing a planarization layer on the driving voltage line and the second sub-power supply line, and providing a light-emitting element including a pixel electrode, an emissive layer and a common electrode on the planarization layer.

The providing the first sub-power supply line on the insulating layer may include providing a first metal layer entirely on the insulating layer, providing a first photoresist pattern on the first metal layer, simultaneously removing a portion of the first metal layer that is not covered by the first photoresist pattern and a portion of the insulating layer, and removing the first photoresist pattern.

The simultaneously removing a portion of the first metal layer that is not covered by the first photoresist pattern and a portion of the insulating layer may include removing 700 Å to 1,200 Å of the insulating layer.

The simultaneously providing the driving voltage line and the second sub-power supply line on the first sub-power supply line may include providing a second metal layer entirely on the insulating layer and the first sub-power supply line, providing a second photoresist pattern on the second metal layer, removing a portion of the second metal layer that is not covered by the second photoresist pattern and a portion of the insulating layer, and removing the second photoresist pattern.

The simultaneously removing a portion of the second metal layer that is not covered by the second photoresist pattern and a portion of the insulating layer may include removing 700 Å to 1,200 Å of the insulating layer.

BRIEF DESCRIPTION OF THE DRAWINGS

These and/or other features of the invention will become apparent and more readily appreciated by describing in further detail embodiments thereof with reference to the accompanying drawings, in which.

DETAILED DESCRIPTION

Figure 1:
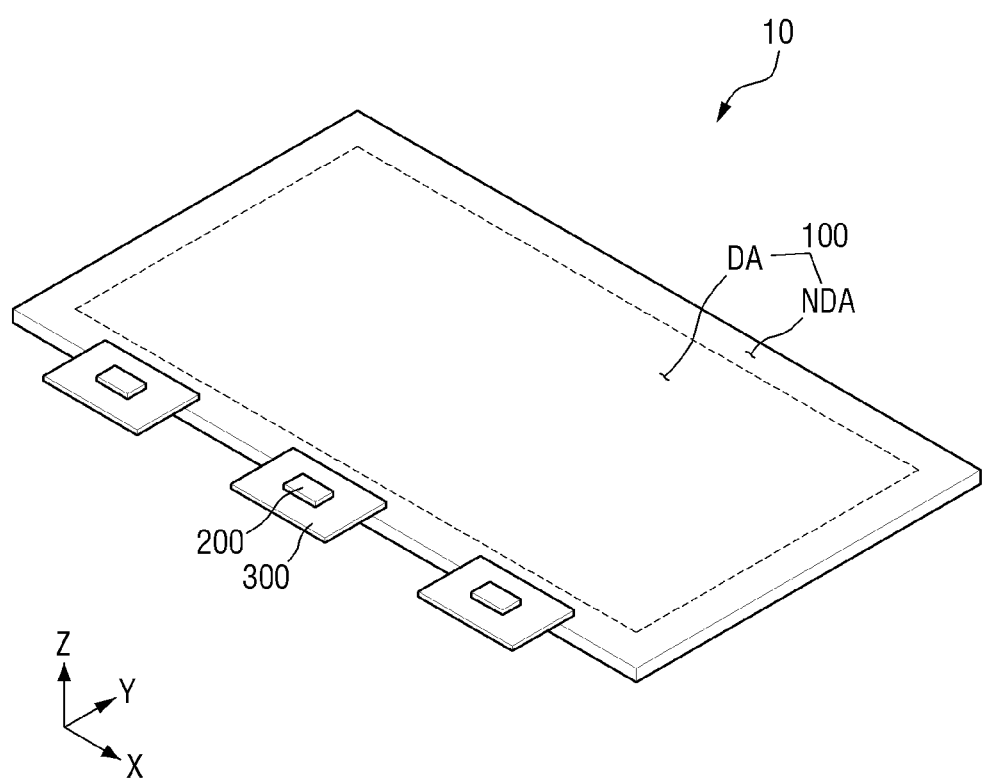
FIG. 1 is a perspective view of an embodiment of a display device.

The invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms.

These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

As a bezel area or a non-display area NDA of a display device 10 is minimized, a planar area of the non-display area NDA in which driving lines from which a driving voltage is applied to a display area DA decreases. As a result, deviations in electrical resistance of the driving lines increases, and there may be a difference between the driving voltage applied to the pixels at a location closer to a driving integrated circuit from which the driving voltage is applied and the driving voltage applied to the pixels at a location farther from the driving integrated circuit (e.g., closer to the pixels in the display area DA). As a result, the luminance of pixels of the display device 10 may become non-uniform.

Hereinafter, embodiments of the invention will be described in detail with reference to the accompanying drawings.

Figure 2:
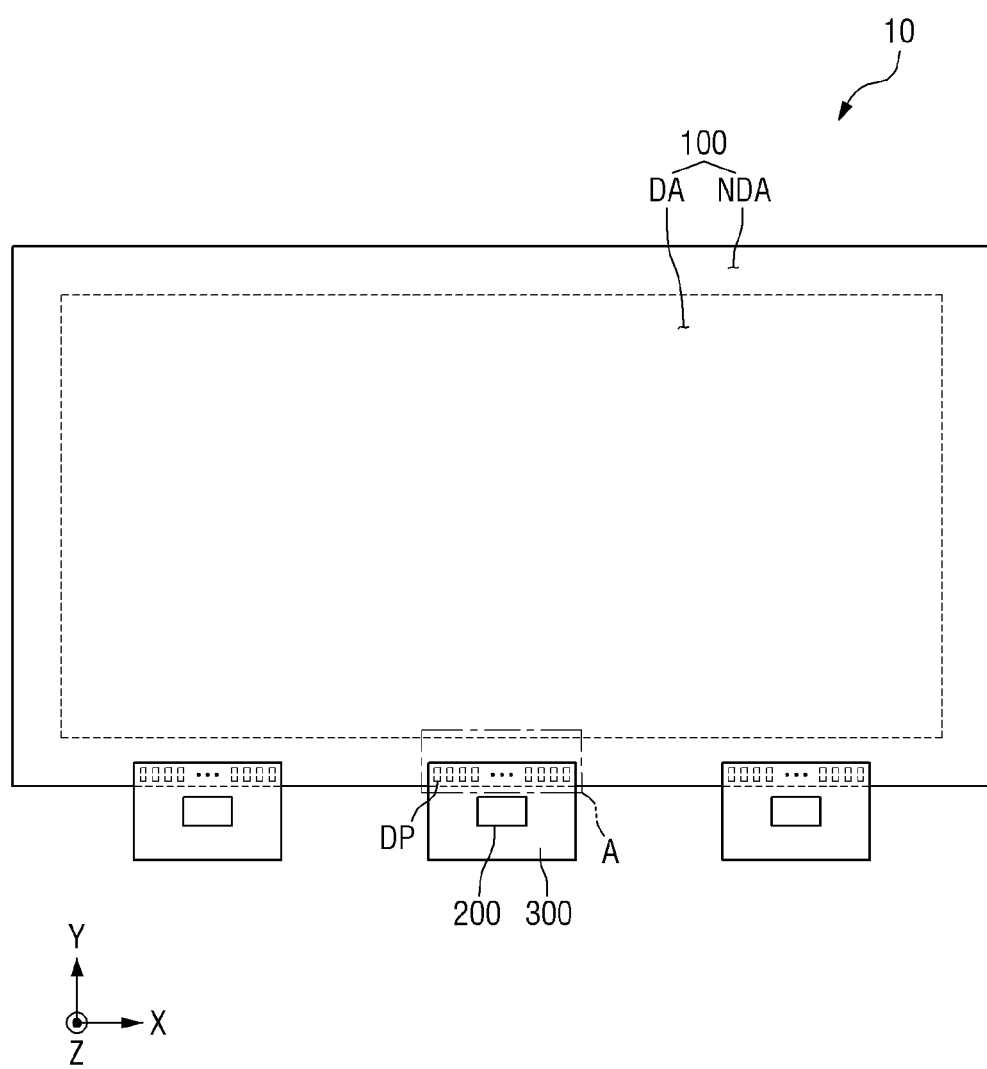
FIG. 2 is a plan view showing an embodiment of a display device.

FIG. 1 is a perspective view of an embodiment of a display device 10. FIG. 2 is a plan view showing an embodiment of a display device 10.

Referring to FIGS. 1 to 2, a display device 10 generates and displays moving images or still images. The display device 10 may be used as the display screen of portable electronic devices such as a mobile phone, a smart phone, a tablet personal computer ("PC"), a smart watch, a watch phone, a mobile communications terminal, an electronic notebook, an electronic book, a portable multimedia player ("PMP"), a navigation device and a ultra mobile PC ("UMPC"), as well as the display screen of various electronic products such as a television, a notebook, a monitor, a billboard and the Internet of Things ("IoT").

The display device 10 may be a light-emitting display device such as an organic light-emitting display device using organic light-emitting diodes, a quantum-dot light-emitting display device including a quantum-dot light-emitting layer, an inorganic light-emitting display device including an inorganic semiconductor, and an ultra-small light-emitting display device using micro or nano light-emitting diodes ("LEDs"), such as micro LEDs or nano LEDs. In the following description, an organic light-emitting display device is described as an example of the display device 10. It is, however, to be understood that the invention is not limited thereto.

The display device 10 includes a display panel 100, a display driving circuit 200 provided in plural including display driving circuits 200, and a circuit board 300 provided in plural including circuit boards 300.

The display panel 100 may be provided or formed in a rectangular shape having longer sides along a first direction (x-axis direction) and shorter sides along a second direction (y-axis direction) crossing the first direction (x-axis direction). In a plan view, each of the corners where a longer side extended along the first direction (x-axis direction) meets a shorter side extended along the second direction (y-axis direction) may be rounded with a predetermined curvature or may be a right angle. The planar shape of the display panel 100 when viewed from the top is not limited to a quadrangular shape, but may be provided or formed in a different polygonal shape, a circular shape or an elliptical shape. The display panel 100 may be provided or formed flat, but is not limited thereto. In an embodiment, for example, the display panel 100 may be provided or formed at left and right ends including a curved portion such as having a constant curvature or a varying curvature. In addition, the display panel 100 may be provided or formed to be flexible so as to be curvable, bendable, foldable and/or rollable.

The display panel 100 may include a display area DA where images are generated and/or displayed, light is generated and/or emitted, etc., and a non-display area NDA. The images and/or light may not be generated or displayed at the non-display area NDA. Alternatively, a substrate SUB (see FIG. 6) of the display panel 100 may include a display area DA and non-display area NDA. That is, various components or layers of the display device 10 may include a display area DA and a non-display area NDA corresponding to those described above for the display device 10.

The display area DA may occupy most of the planar area of the display panel 100. The display area DA may be disposed at the center of display panel 100. In the display area DA, pixels may be disposed to display images.

The non-display area NDA may be disposed adjacent to the display area DA. The non-display area NDA may be disposed on the outer side of the display area DA and closer to an outer edge of the display device 10. In an embodiment, the non-display area NDA may surround the display area DA. The non-display area NDA may be defined as the border of the display panel 100. The non-display area NDA may correspond to a bezel of the display device 10.

In the non-display area NDA, a display pad DP provided in plural including a plurality of display pads DP may be disposed to be connected to the circuit boards 300. The display pads DP may be disposed at a same one edge of the display panel 100. In an embodiment, for example, the display pads DP may be disposed at the lower edge of the display panel 100. The display pads DP may be electrically connected to signal lines of the display panel 100.

The circuit boards 300 may be disposed on and corresponding to the display pads DP disposed at one edge of the display panel 100. The circuit boards 300 may be attached to the display pads DP using a low-resistance, high-reliability material such as an anisotropic conductive film and/or a self-assembly anisotropic conductive paste ("SAP"). Accordingly, the circuit boards 300 may be electrically connected to signal lines of the display panel 100 by the display pads DP. The display panel 100 may receive an electrical signal such as data voltages, supply voltages, scan timing signals, etc. through the circuit boards 300 from outside the display panel 100. The circuit boards 300 may be a flexible printed circuit board, a printed circuit board or a flexible film such as a chip on film.

The display driving circuits 200 may generate electrical signals such as data voltages, supply voltages, scan timing signals, etc. The display driving circuits 200 may supply electrical signals such as data voltages, supply voltages, scan timing signals, etc. from outside the display panel 100 to the display panel 100 through the circuit boards 300.

Each of the display driving circuit 200 may be implemented as an integrated circuit ("IC") and may be attached to a respective one of the circuit boards 300. Alternatively, the display driving circuits 200 may be attached to the display panel 100 by chip-on-glass ("COG") technique, chip-on-plastic ("COP") technique or ultrasonic bonding.

Figure 3:
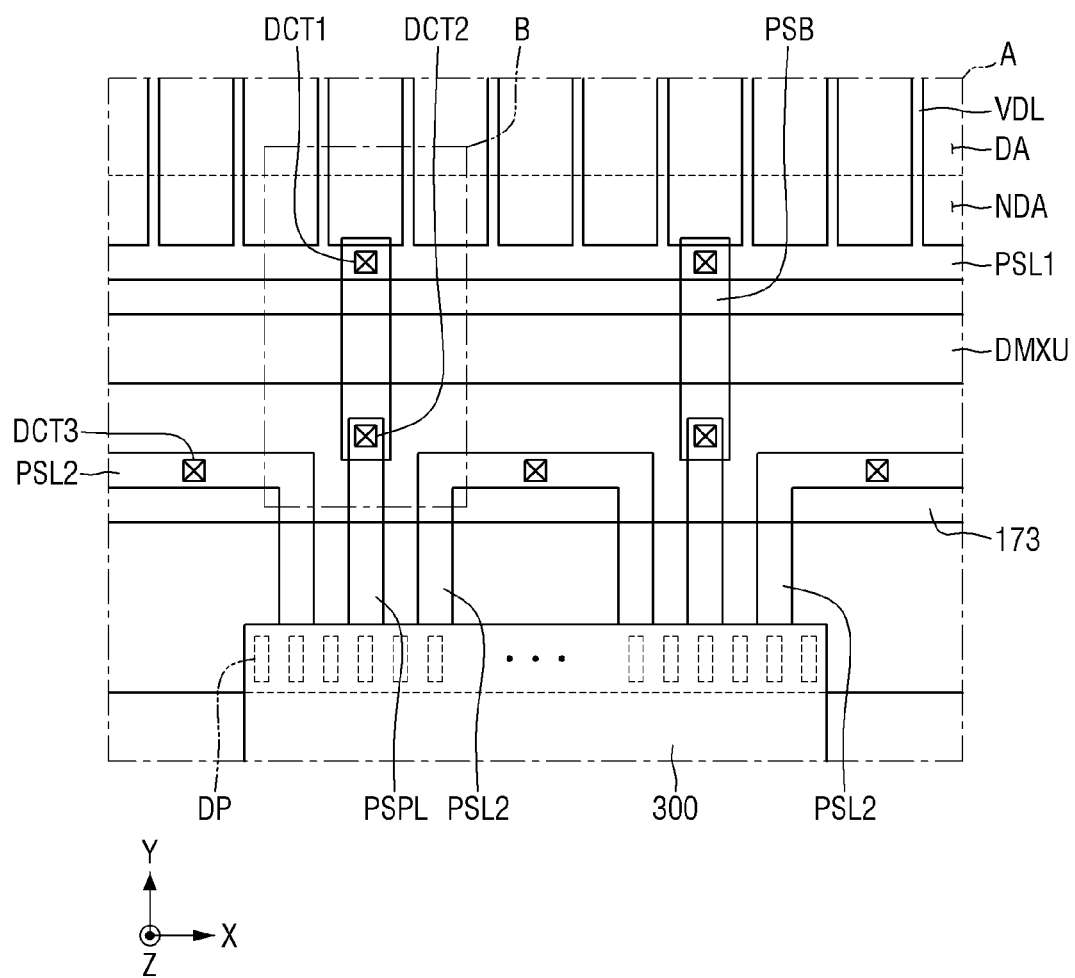
FIG. 3 is an enlarged plan view of area A of FIG. 2.

FIG. 3 is an enlarged plan view showing an embodiment of area A of FIG. 2.

For convenience of illustration, FIG. 3 shows only a first power supply line PSL1, a first power supply pad line PSPL provided in plural including first power supply pad lines PSPL, a power supply bridge PSB provided in plural including power supply bridges PSB, a second power supply line PSL2 provided in plural including second power supply lines PSL2, the display pads DP and a demux unit DMXU in the non-display area NDA, driving voltage lines VDL in the display area DA, a common electrode 173, and a circuit board 300.

Referring to FIG. 3, the first power supply line PSL1, the first power supply pad lines PSPL, the power supply bridges PSB, the second power supply lines PSL2 and the demux unit DMXU may be disposed in the non-display area NDA. The driving voltage lines VDL and the common electrode 173 may be disposed in both the display area DA and the non-display area NDA.

The first power supply line PSL1 and the demux unit DMXU may be extended along the first direction (x-axis direction). The first power supply pad lines PSPL, the power supply bridges PSB and the driving voltage lines VDL may be extended along the second direction (y-axis direction) and spaced apart from each other along the first direction (x-axis direction).

The first power supply line PSL1 may be connected to the driving voltage lines VDL. The driving voltage lines VDL may protrude from the upper side of the first power supply line PSL1 along the second direction (y-axis direction). The first power supply line PSL1 and the driving voltage lines VDL may together form a power supply member or a driving voltage member.

Each of the first power supply pad lines PSPL may be connected to a respective one of the display pads DP. Each of the first power supply pad lines PSPL of the display panel 100 may receive a first supply voltage of the display driving circuit 200 through the circuit board 300.

Each of the power supply bridges PSB may connect the first power supply line PSL1 with the first power supply pad line PSPL. A first end of the power supply bridge PSB may be connected to the first power supply line PSL1 at or through a first power connection contact hole DCT1. A second end of the power supply bridge PSB which is opposite to the first end thereof may be connected to the first power supply pad line PSPL at or through a second power connection contact hole DCT2. Each of the power supply bridges PSB may overlap the demux unit DMXU along a third direction (z-axis direction) which crosses bot the (x-axis direction) and the second direction (y-axis direction).

Each of the second power supply lines PSL2 may be connected to a respective one of the display pads DP. The display pads DP to which the first power supply pad lines PSPL and the second power supply lines PSL2 may correspond to a same one of the circuit board 300 without being limited thereto. Each of the second power supply lines PSL2 may receive a second supply voltage of the display driving circuit 200 through the circuit board 300. The second supply voltage may be a voltage having a lower level than that of the first supply voltage. In an embodiment, for example, the first supply voltage may be a high-level driving voltage, and the second supply voltage may be a low-level driving voltage.

In a plan view, each of the second power supply lines PSL2 may be bent at least once to include a bent portion. Referring to FIG. 3, a first one of the second power supply lines PSL2 may be extended along the second direction (y-axis direction), may be bent to the left along the first direction (x-axis direction), and then may be further extended along the first direction (x-axis direction). A second one of the second power supply lines PSL2 may be extended along the second direction (y-axis direction), may be bent to the right along the first direction (x-axis direction), and then may be further extended along the first direction (x-axis direction). A third one of the second power supply lines PSL2 may be extended in the second direction (y-axis direction), may be bent to the right and extended in the first direction (x-axis direction), and then may be further bent in a direction opposite to the second direction (y-axis direction). In such case, the third one of the second power supply lines PSL2 may be connected to one of the display pads DP, and an opposing end thereof may be connected to another one of the display pads DP.

In a plan view, the demux unit DMXU may be disposed between the first power supply line PSL1 and the first power supply pad line PSPL along the second direction (y-axis direction). The demux unit DMXU may be disposed between the first power supply line PSL1 and the second power supply line PSL2 along the second direction (y-axis direction). The demux unit DMXU may be extended along the first direction (x-axis direction) to dispose a major dimension along the first direction (x-axis direction).

Figure 4:
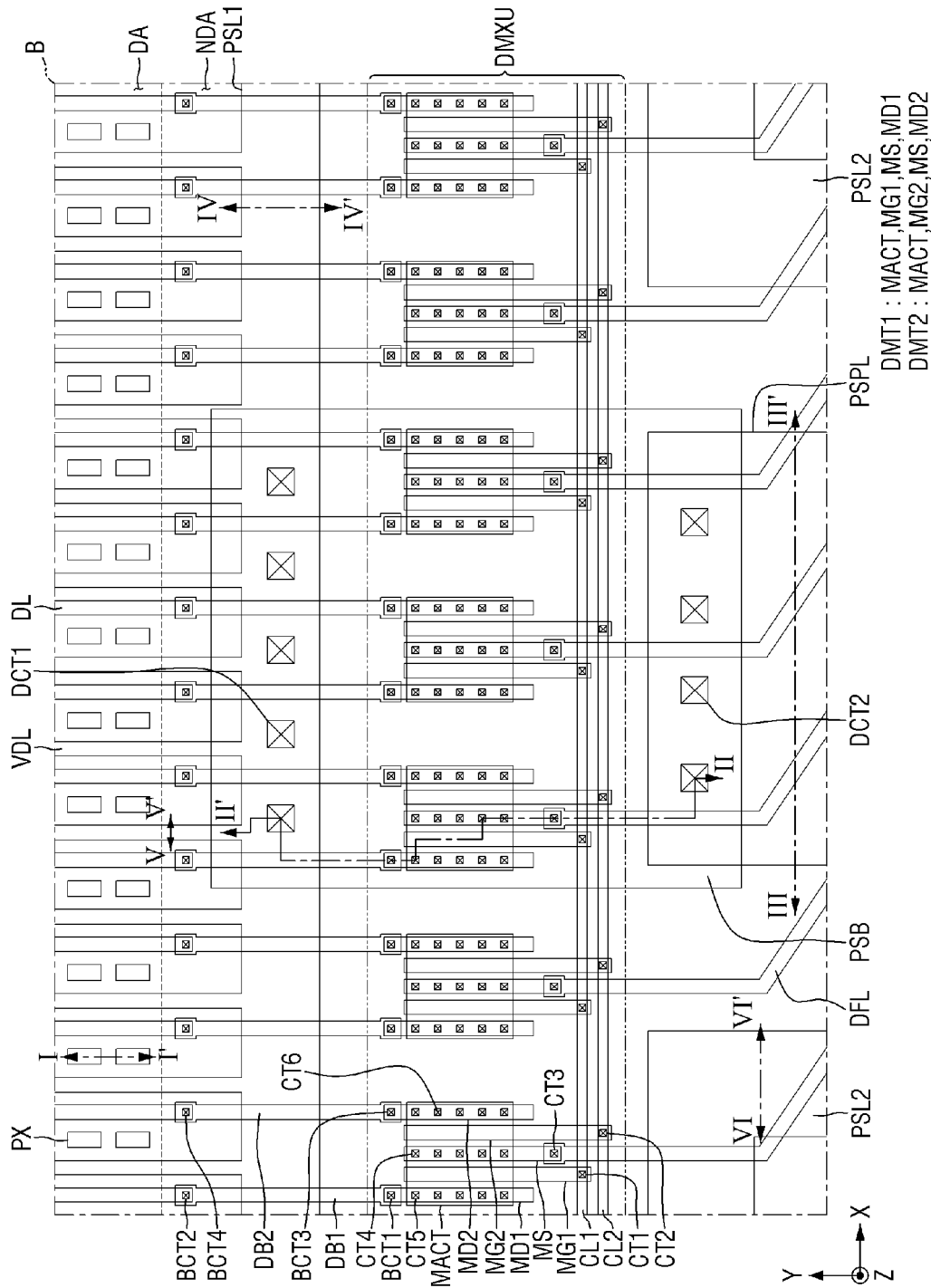
FIG. 4 is an enlarged plan view of area B of FIG. 3.

The demux unit DMXU may include a plurality of demux transistors DMT1 and DMT2 (see FIG. 4) for distributing data voltages of a data fan-out line DFL provided in plural including a plurality of data fan-out lines DFL (see FIG. 4) to one of a data line DL among a plurality of data lines DL (see FIG. 4). The demux unit DMXU will be described later with reference to FIG. 4.

The common electrode 173 may be disposed in the display area DA and the non-display area NDA. The common electrode 173 may overlap the second power supply lines PSL2 along the third direction (z-axis direction). The common electrode 173 may be connected to each of the second power supply line PSL2 through a third power connection contact hole DCT3. Accordingly, the second supply voltage may be applied to the common electrode 173.

FIG. 4 is an enlarged plan view of an embodiment of area B of FIG. 3.

For convenience of illustration, FIG. 4 shows only the first power supply line PSL1, the first power supply pad line PSPL, the power supply bridge PSB, the second power supply line PSL2, the data fan-out lines DFL, the demux unit DMXU and the data lines DL, the driving voltage lines VDL and a sub-pixel PX provided in plural including sub-pixels PX of a pixel in the display area DA.

In FIG. 4, the first power supply line PSL1, the first power supply pad line PSPL, the power supply bridge PSB, the second power supply line PSL2 and the driving voltage lines VDL have been described above with reference to FIG. 3 and, therefore, the redundant description will be omitted.

Referring to FIG. 4, the data fan-out lines DFL may be connected to the display pads DP (see FIG. 3), respectively. In other words, each of the data fan-out lines DFL may be connected to the display pad DP as a second display pad among the display pads DP (see FIG. 3). Accordingly, each of the data fan-out lines DFL may receive the data voltage of the display driving circuit 200 through the circuit board 300. Each of the data fan-out lines DFL may be bent at least once in the plan view.

Each of the first power supply pad lines PSPL and the power supply bridge PSB may overlap the data fan-out lines DFL along the third direction (z-axis direction). Each of the second power supply lines PSL2 may overlap the data fan-out lines DFL in the third direction (z-axis direction).

The demux unit DMXU may include a first control line CL1, a second control line CL2, and first and second demux transistors DMT1 and DMT2.

The first control line CL1 and the second control line CL2 may be extended along the first direction (x-axis direction). The first control line CL1 may be connected to the display pad DP as a first display pad among the display pads DP (see FIG. 3) to receive a first control signal from the display driving circuit 200. The second control line CL2 may also be connected to the display pad DP a first display pad among the display pads DP (see FIG. 3) to receive a second control signal from the display driving circuit 200.

The first demux transistor DMT1 may include a common active layer MACT, a first demux gate electrode MG1, a common source electrode MS and a first demux drain electrode MD1. The second demux transistor DMT2 may include a common active layer MACT, a second demux gate electrode MG2, a common source electrode MS and a second demux drain electrode MD2.

The common active layer MACT may be commonly provided or formed in the first demux transistor DMT1 and the second demux transistor DMT2. The common active layer MACT may overlap the first demux drain electrode MD1, the first demux gate electrode MG1, the common source electrode MS, the second demux gate electrode MG2 and the second demux drain electrode MD2 along the third direction (z-axis direction).

The first demux gate electrode MG1 may be connected to the first control line CL1 through a first contact hole CT1. The first demux gate electrode MG1 may be disposed between the first demux drain electrode MD1 and the common source electrode MS along the first direction (x-axis direction). The first demux gate electrode MG1 may include a major dimension extended along the second direction (y-axis direction).

The second demux gate electrode MG2 may be connected to the second control line CL2 through a second contact hole CT2. The second demux gate electrode MG2 may be disposed between the common source electrode MS and the second demux drain electrode MD2 along the first direction (x-axis direction). The second demux gate electrode MG2 may include a major dimension extended along the second direction (y-axis direction).

The common source electrode MS may be commonly provided or formed in the first demux transistor DMT1 and the second demux transistor DMT2. The common source electrode MS may be connected to the data fan-out line DFL through a third contact hole CT3. The common source electrode MS may be connected to the common active layer MACT through a fourth contact hole CT4. The common source electrode MS may include a major dimension extended along the second direction (y-axis direction).

The first demux drain electrode MD1 may be connected to the common active layer MACT through a fifth contact hole CT5 provided in plural including a plurality of fifth contact holes CT5. The first demux drain electrode MD1 may be connected to a first data bridge DB1 through a first bridge contact hole BCT1. The first demux drain electrode MD1 may include a major dimension extended along the second direction (y-axis direction).

The second demux drain electrode MD2 may be connected to the common active layer MACT through a sixth contact hole CT6 provided in plural including a plurality of sixth contact holes CT6. The second demux drain electrode MD2 may be connected to a second data bridge DB2 through a third bridge contact hole BCT3. The second demux drain electrode MD2 may include a major dimension extended along the second direction (y-axis direction).

The first data bridge DB1 may connect the first demux drain electrode MD1 of the first demux transistor DMT1 with the data line DL. A first end of the first data bridge DB1 may be connected to the first demux drain electrode MD1 at or through the first bridge contact hole BCT1, and a second end opposite to the first end thereof may be connected to the data line DL at or through the second bridge contact hole BCT2.

The first data bridge DB1 may overlap the first power supply line PSL1 along the third direction (z-axis direction).

The first data bridge DB1 may cross the first power supply line PSL1. The first data bridge DB1 may include a major dimension extended along the second direction (y-axis direction).

The second data bridge DB2 may connect the second demux drain electrode MD2 of the second demux transistor DMT2 with the data line DL. A first end of the second data bridge DB2 may be connected to the second demux drain electrode MD2 at or through the third bridge contact hole BCT3, and a second end opposite to the first end thereof may be connected to the data line DL at or through the fourth bridge contact hole BCT4.

The second data bridge DB2 may overlap the first power supply line PSL1 along the third direction (z-axis direction). The second data bridge DB2 may cross the first power supply line PSL1. The second data bridge DB2 may include a major dimension extended along the second direction (y-axis direction).

As shown in FIG. 4, when the first demux transistor DMT1 is turned on by the first control signal of the first control line CL1, the data line DL (e.g., first data line) connected to the first data bridge DB1 may receive the data voltage of the data fan-out line DFL. When the second demux transistor DMT2 is turned on by the second control signal of the second control line CL2, the data line DL (e.g., second data line) connected to the second data bridge DB2 may receive the data voltage of the data fan-out line DFL. In an embodiment, the first and second demux transistors DMT1 and DMT2 may apply the data voltages of a same one of the data fan-out line DFL to a plurality of data lines DL at different timings, and thus reducing the number of the data fan-out lines DFL and the number of the display pads DP is possible.

The power supply bridge PSB may connect the first power supply line PSL1 with the first power supply pad line PSPL by avoiding electrical connection with the demux transistors DMT1 and DMT2 of the demux unit DMXU. The power supply bridge PSB may overlap the plurality of demux transistors DMT1 and DMT2 along the third direction (z-axis direction).

The sub-pixels PX may be arranged in a matrix along the first direction (x-axis direction) and along the second direction (y-axis direction). Each of the sub-pixels PX may be electrically connected to a data line DL and a driving voltage line VDL disposed on one side (e.g., left or right hand) thereof Accordingly, each of the sub-pixels PX may control the electrical current flowing from the first supply voltage of the driving voltage line VDL to a light-emitting element LEL based on the data voltage applied from the data line DL, thereby adjusting the luminance of light generated and/or emitted from the light-emitting element LEL. Each of the sub-pixels PX will be described later with reference to FIG. 5.

Although the sub-pixels PX are disposed between the driving voltage line VDL and the data line DL along the first direction (x-axis direction) in FIG. 4, the invention is not limited thereto. In an embodiment, for example, the sub-pixels PX may overlap at least one of the driving voltage line VDL and the data line DL along the third direction (z-axis direction).

As the size of the non-display area NDA of the display device 10 decreases, a dimension along the second direction (y-axis direction) is decreased, and thus a corresponding dimension (e.g., a width) of the first power supply line PSL1 along the second direction (y-axis direction) is reduced. As a result, the electrical resistance of the first power supply line PSL1 increases, and thus deviations in electrical resistance between the driving voltage lines VDL connected to the first power supply line PSL1 may increase. In an embodiment, for example, there may be a difference between the driving voltage applied to pixels (or sub-pixels PX) located closer to the circuit board 300 and the driving voltage applied to pixels (or sub-pixels PX) located farther from the circuit board 300. As a result, the luminance of the pixels of the display device 10 may become non-uniform. Therefore, one or more embodiment provides a display device 10 having increased uniformity in luminance of the pixels of the display device 10 without increasing the dimension (e.g., the width) of the first power supply line PSL1.

Figure 5:
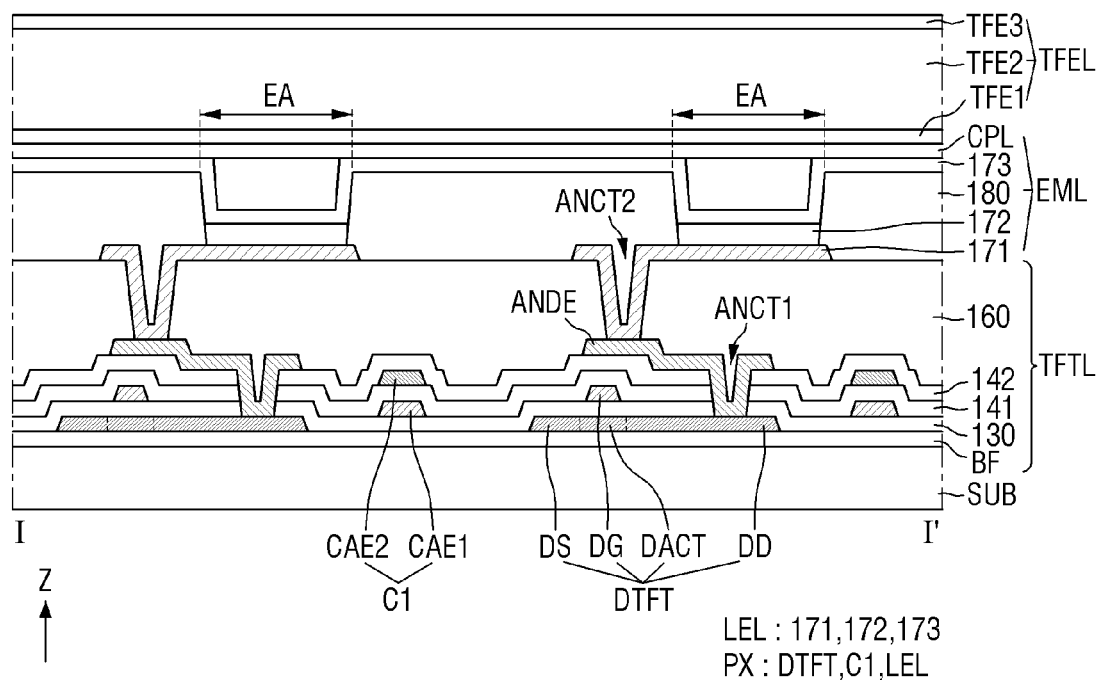
FIG. 5 is a cross-sectional view showing an embodiment of a sub-pixel taken along line I-I' of FIG. 4.

FIG. 5 is an enlarged cross-sectional view showing an embodiment of the sub-pixels PX taken along line I-I' of FIG. 4.

Referring to FIG. 5, each of the sub-pixels PX may include at least one of a display transistor DTFT, a capacitor Cl and a light-emitting element LEL. The display transistor DTFT as a thin-film transistor is connected to the light-emitting element LEL.

A substrate SUB may include or be made of an insulating material such as a polymer resin and glass. In an embodiment, for example, the substrate SUB may include polyimide. In such case, the substrate SUB may be a flexible substrate that is bendable, foldable or rollable.

A thin-film transistor layer TFTL including a display transistor DTFT as a thin-film transistor, and a capacitor Cl, of each of the sub-pixels PX may be disposed on the substrate SUB. The thin-film transistor layer TFTL may include the display transistor DTFT, an anode connection electrode ANDE, a buffer layer BF, a gate insulating layer 130, a first interlayer dielectric layer 141, a second interlayer dielectric layer 142 and a planarization layer 160.

The buffer layer BF may be disposed on the substrate SUB. The buffer layer BF may include be formed of a silicon nitride layer, a silicon oxynitride layer, a silicon oxide layer, a titanium oxide layer or an aluminum oxide layer.

The display transistor DTFT may be disposed on the buffer layer BF. The display transistor DTFT may include a display active layer DACT, a display gate electrode DG, a display source electrode DS and a display drain electrode DD.

The display active layer DACT, the display source electrode DS and the display drain electrode DD of the display transistor DTFT may be disposed on the buffer layer BF. The display active layer DACT may include silicon semiconductor such as polycrystalline silicon, monocrystalline silicon, low-temperature polycrystalline silicon and amorphous silicon. The display source electrode DS and the display drain electrode DD may have electrical conductivity by doping a silicon semiconductor with ions or impurities. The display active layer DACT may overlap the display gate electrode DG along the third direction (z-axis direction), and the display source electrode DS and the display drain electrode DD may not overlap the display gate electrode DG along the third direction (z-axis direction). The third direction (z-axis direction) may be defined as a thickness direction of the substrate SUB, the display panel 100 and/or the display device 10.

The gate insulating layer 130 may be disposed on the display active layer DACT, the display source electrode DS and the display drain electrode DD of the display transistor DTFT. The gate insulating layer 130 may include or be formed of an inorganic layer, for example, a silicon nitride layer, a silicon oxynitride layer, a silicon oxide layer, a titanium oxide layer or an aluminum oxide layer.

The display gate electrode DG of the display transistor DTFT and a first capacitor electrode CAE1 may be disposed on the gate insulating layer 130. The display gate electrode DG may overlap the display active layer DACT along the third direction (z-axis direction). The first capacitor electrode CAE1 may overlap a second capacitor electrode CAE2 along the third direction (z-axis direction). The display gate electrode DG may include or be made of a single layer or multiple layers among molybdenum (Mo), aluminum (Al), chromium (Cr), gold (Au), titanium (Ti), nickel (Ni), neodymium (Nd) and copper (Cu) and an alloy thereof.

The first interlayer dielectric layer 141 may be disposed on the display gate electrode DG and the first capacitor electrode CAE1. The first interlayer dielectric layer 141 may include or be formed of an inorganic layer, for example, a silicon nitride layer, a silicon oxynitride layer, a silicon oxide layer, a titanium oxide layer or an aluminum oxide layer.

The second capacitor electrode CAE2 may be disposed on the first interlayer dielectric layer 141. Since the first interlayer dielectric layer 141 has a predetermined dielectric constant, a capacitor Cl can be provided by formed by the first capacitor electrode CAE1, the second capacitor electrode CAE2, and the first interlayer dielectric layer 141 disposed between the first capacitor electrode CAE1 and the second capacitor electrode CAE2. The second capacitor electrode CAE2 may include or be made of a single layer or multiple layers of one of molybdenum (Mo), aluminum (Al), chromium (Cr), gold (Au), titanium (Ti), nickel (Ni), neodymium (Nd) and copper (Cu) or an alloy thereof A second interlayer dielectric layer 142 may be disposed over the second capacitor electrode CAE2. The second interlayer dielectric layer 142 may include or be formed of an inorganic layer, for example, a silicon nitride layer, a silicon oxynitride layer, a silicon oxide layer, a titanium oxide layer or an aluminum oxide layer.

The anode connection electrode ANDE may be disposed on the second interlayer dielectric layer 142. The anode connection electrode ANDE may be connected to the display drain electrode DD at or through a first anode contact hole ANCT1 that penetrates the first interlayer dielectric layer 141 and the second interlayer dielectric layer 142 to expose the display drain electrode DD of the display transistor DTFT to outside the first interlayer dielectric layer 141 and the second interlayer dielectric layer 142. The anode connection electrode ANDE may include or be made of a single layer or multiple layers among molybdenum (Mo), aluminum (Al), chromium (Cr), gold (Au), titanium (Ti), nickel (Ni), neodymium (Nd) and copper (Cu) and an alloy thereof.

The planarization layer 160 provides a flat surface over the anode connection electrode ANDE. The planarization layer 160 may include or be formed of an organic layer such as an acryl resin, an epoxy resin, a phenolic resin, a polyamide resin and a polyimide resin.

An emission material layer EML may be disposed on the planarization layer 160. The emission material layer EML may include the light-emitting element LEL provided in plural including light-emitting elements LEL and a bank 180. Each of the light-emitting elements LEL includes a pixel electrode 171 (e.g., a first electrode), an emissive layer 172 and a common electrode 173 (e.g., a second electrode). The common electrode 173 may be commonly connected to the plurality of light-emitting elements LEL.

The pixel electrode 171 may be provided or formed on the planarization layer 160. The pixel electrode 171 may be connected to the anode connection electrode ANDE at or through a second anode contact hole ANCT2 that penetrates the planarization layer 160 and exposes the anode connection electrode ANDE to outside the planarization layer 160.

In a top-emission structure in which light exits from the emissive layer 172 toward the common electrode 173, the pixel electrode 171 may include or be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The bank 180 on the planarization layer 160 may define an opening therein which corresponds to an emission area EA and exposes a portion of the pixel electrode 171 to outside the bank 180. At the emission area EA, the pixel electrode 171, the emissive layer 172 and the common electrode 173 are stacked on one another sequentially in order from the substrate SUB, so that holes from the pixel electrode 171 and electrons from the common electrode 173 are combined with each other in the emissive layer 172 to generate and emit light. A solid portion of the bank 180 may cover an edge of the pixel electrode 171. The bank 180 may include or be formed of an organic layer such as an acryl resin, an epoxy resin, a phenolic resin, a polyamide resin and a polyimide resin.

The emissive layer 172 is provided or formed on the pixel electrode 171 and the bank 180. The emissive layer 172 may include an organic material and emit light of a certain color. In an embodiment, for example, the emissive layer 172 may include a hole transporting layer, an organic material layer and an electron transporting layer.

The common electrode 173 is provided or formed on the emissive layer 172. The common electrode 173 faces the pixel electrode 171 with the emissive layer 172 therebetween. The common electrode 173 may be provided or formed to cover the emissive layer 172. The common electrode 173 may be a common layer provided or formed across all of the emission areas EA. The common electrode 173 may be in the opening defined in the bank 180 and along a side surface of the bank 180 to extend outside the opening and along an upper surface of the bank 180. A capping layer CPL may be provided or formed on the common electrode 173.

In the top-emission structure, the common electrode 173 may include or be formed of a transparent conductive oxide ("TCO") such as indium tin oxide ("ITO") and indium zinc oxide ("IZO") that can transmit light, or a semi-transmissive conductive material such as magnesium (Mg), silver (Ag) and an alloy of magnesium (Mg) and silver (Ag). When the common electrode 173 includes a semi-transmissive metal material, the light extraction efficiency can be increased by using microcavities within the sub-pixel PX.

An encapsulation layer TFEL may be disposed on the common electrode 173. The encapsulation layer TFEL includes at least one inorganic layer to reduce or effectively prevent permeation of oxygen or moisture into the emission material layer EML. In addition, the encapsulation layer TFEL includes at least one organic layer to protect the light-emitting element layer EML from foreign substances such as dust. In an embodiment, for example, the encapsulation layer TFEL may include a first inorganic layer TFE1, an organic layer TFE2 and a second inorganic layer TFE3.

The first inorganic layer TFE1 may be disposed on the common electrode 173, the organic layer TFE2 may be disposed on the first inorganic layer TFE1, and the second inorganic layer TFE3 may be disposed on the organic layer TFE2. The first inorganic layer TFE1 and the second inorganic layer TFE3 may include or be made of multiple layers in which one or more inorganic layers of a silicon nitride layer, a silicon oxynitride layer, a silicon oxide layer, a titanium oxide layer and an aluminum oxide layer are alternately stacked on one another. The organic layer TFE2 may include or be formed of acryl resin, an epoxy resin, a phenolic resin, a polyamide resin, a polyimide resin, etc.

Instead of the encapsulation layer TFEL, a filling layer, a sealing material and/or an encapsulation substrate may be disposed to prevent permeation of oxygen or moisture into the emission material layer EML and/or protect the light-emitting element layer EML from foreign substances. The encapsulation substrate may be an insulating substrate including an insulating material such as glass and plastic. The filling layer may be, but is not limited to, an air layer in a vacuum state. The sealing material may be disposed in the non-display area NDA (see FIGS. 1 and 2) of the display panel 100 and may surround the display area DA in the plan view.

Figure 6:
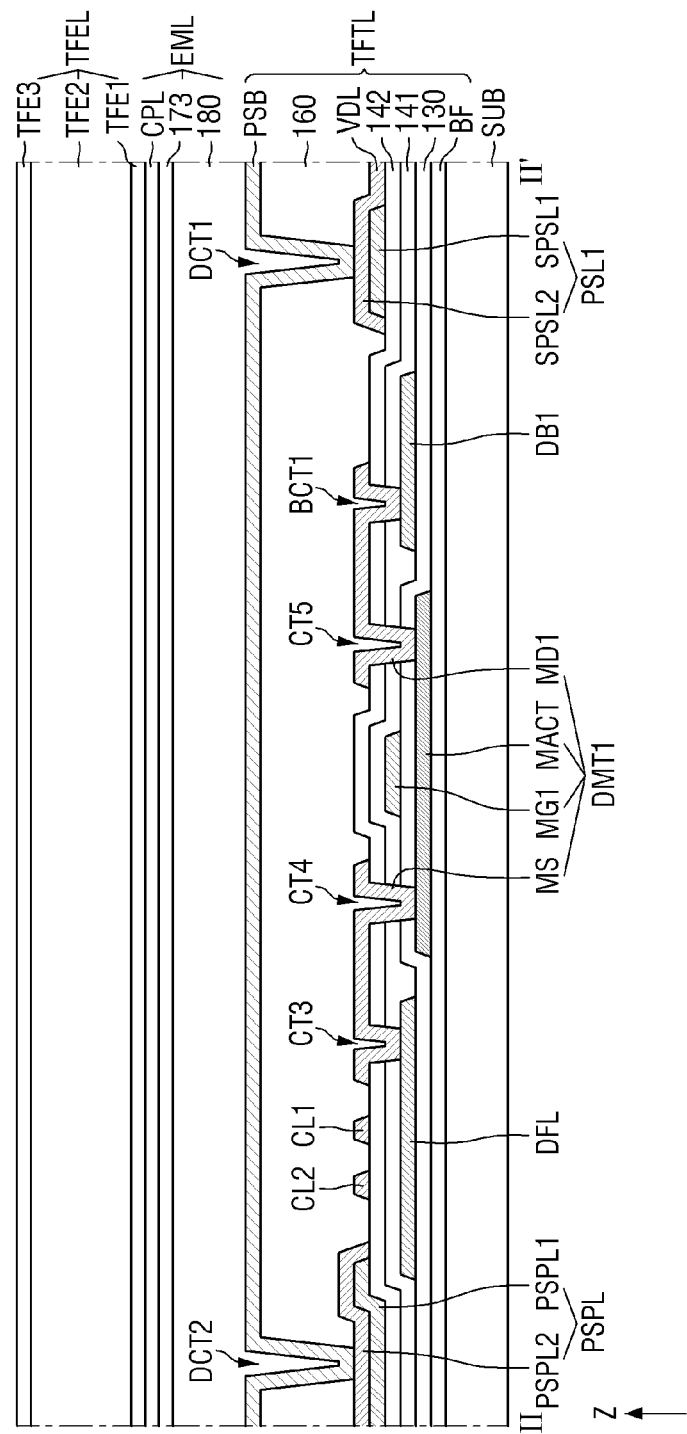
FIG. 6 is a cross-sectional view showing an embodiment of a display panel taken along line II-II' of FIG. 4.
Figure 7:
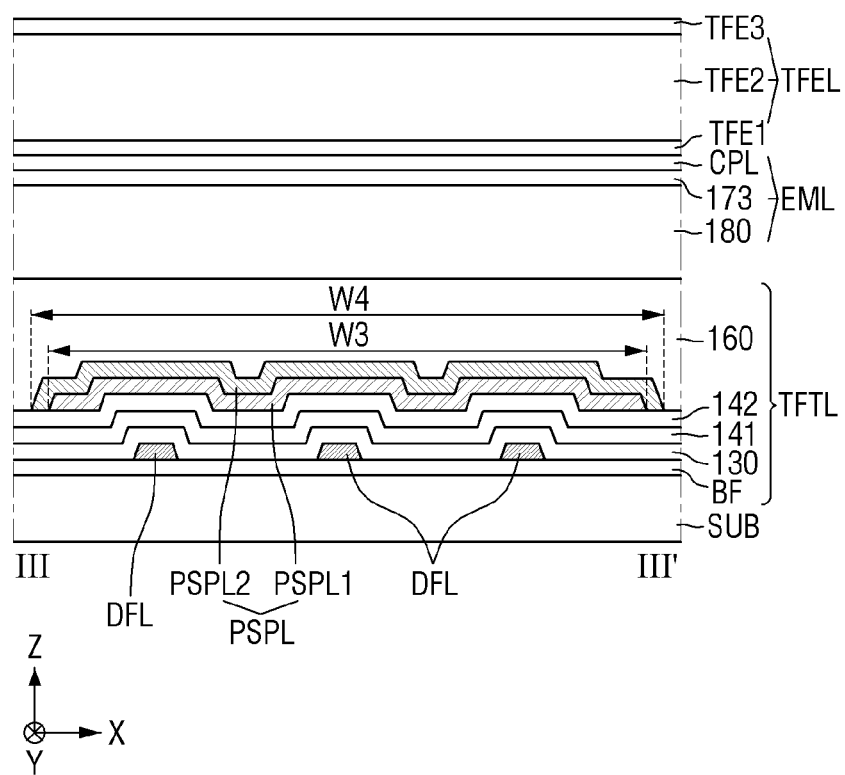
FIG. 7 is a cross-sectional view showing an embodiment of the display panel taken along line III-III' of FIG. 4.
Figure 8:
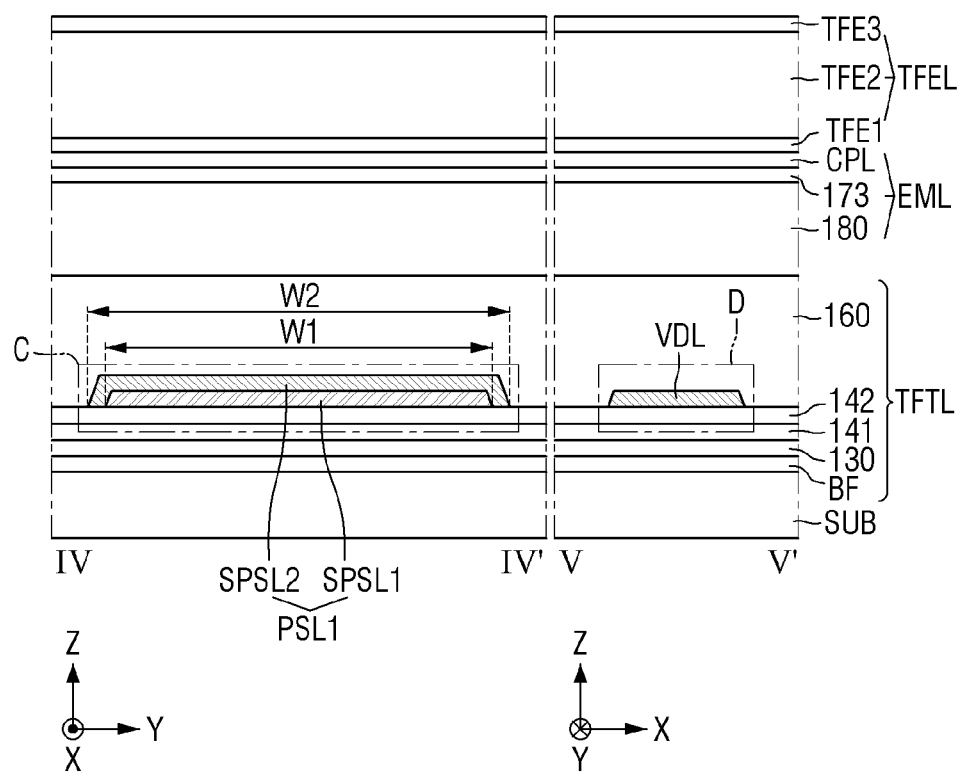
FIG. 8 is a cross-sectional view showing an embodiment of the display panel taken along lines IV-IV' and V-V' of FIG. 4.

FIG. 6 is an enlarged cross-sectional view showing an embodiment of a display panel 100 taken along line II-II' of FIG. 4. FIG. 7 is an enlarged cross-sectional view showing an embodiment of the display panel 100 taken along line III-III' of FIG. 4. FIG. 8 is an enlarged cross-sectional view showing an embodiment of the display panel 100 taken along lines IV-IV' and V-V' of FIG. 4.

Referring to FIGS. 6 to 8, the common active layer MACT of the first demux transistor DMT1 may be disposed on the buffer layer BF. The gate insulating layer 130 may be disposed on the common active layer MACT. The common active layer MACT may be disposed on the same layer as the display active layer DACT of the display transistor DTFT and may include or be formed of the same material. In an embodiment, the common active layer MACT of the first demux transistor DMT1 may be disposed in a same layer as the display active layer DACT of the display transistor DTFT. As being in a same layer, elements may be respective patterns of a same material layer. That is, the common active layer MACT in the non-display area NDA and the display active layer DACT of the display area DA may be respective patterns of a same material layer on the substrate SUB. In embodiments, elements which are provided or formed simultaneously may also be in a same layer as each other.

The first demux gate electrode MG1 of the first demux transistor DMT1, the data fan-out line DFL, and the first data bridge DB1 may be disposed on the gate insulating layer 130. The second demux gate electrode MG2 (see FIG. 4) and the second data bridge DB2 (see FIG. 4) may also be disposed on the gate insulating layer 130. The first interlayer dielectric layer 141 may be disposed on the first demux gate electrode MG1, the second demux gate electrode MG2 (see FIG. 4), the data fan-out line DFL, the second data bridge DB2 (see FIG. 4), and the first data bridge DB1. The first demux gate electrode MG1, the second demux gate electrode MG2 (see FIG. 4), the data fan-out line DFL, the second data bridge DB2 (see FIG. 4) and the first data bridge DB1 may be disposed on the same layer as the display gate electrode DG and the first capacitor electrode CAE1 of the display transistor DTFT and may include or be formed of the same material. In an embodiment, the first demux gate electrode MG1, the second demux gate electrode MG2, the data fan-out line DFL, the second data bridge DB2 and the first data bridge DB1 of the non-display area NDA may be in a same layer as the display gate electrode DG and the first capacitor electrode CAE1 of the display area DA.

The first power supply line PSL1 may include a first sub-power supply line SPSL1 (e.g., first sub-power supply line layer) and a second sub-power supply line SPSL2 (e.g., second sub-power supply line layer). The second sub-power supply line SPSL2 may be disposed on the first sub-power supply line SPSL1. The second sub-power supply line SPSL2 may be further from the substrate SUB than the first sub-power supply line SPSL1. The second sub-power supply line SPSL2 may extend along the upper side and the side surfaces of the first sub-power supply line SPSL1.

The second width W2 of the second sub-power supply line SPSL2 may be larger than the first width W1 of the first sub-power supply line SPSL1. The second sub-power supply line SPSL2 extends further than the first sub-power supply line SPSL1 to define an extended portion of the second sub-power supply line SPSL2. The widths may indicate a maximum dimension of the respective supply line. In an embodiment, for example, since the first power supply line PSL1 includes a major dimension (e.g., length) which extends along the first direction (x-axis direction), the first width W1 of the first sub-power supply line SPSL1 may refer to a minor dimension of the first sub-power supply line SPSL1 along the second direction (y-axis direction), and the second width W2 of the second sub-power supply line SPSL2 may refer to a minor dimension of the second sub-power supply line SPSL2 along the second direction (y axis direction). The second sub-power supply line SPSL2 may cover the first sub-power supply line SPSL1. The second sub-power supply line SPSL2 may be in contact with the first sub-power supply line SPSL1. As being in contact (e.g., physical contact), elements may form an interface therebetween.

The first power supply pad line PSPL may include a first sub-power supply pad line PSPL1 and a second sub-power supply pad line PSPL2. The second sub-power supply pad line PSPL2 may be disposed on the first sub-power supply pad line PSPL1. The second sub-power supply pad line PSPL2 may extend along the upper surface and side surfaces of the first sub-power supply pad line PSPL1.

The fourth width W4 of the second sub-power supply pad line PSPL2 may be larger than the third width W3 of the first sub-power supply pad line PSPL1. In an embodiment, for example, since the first power supply pad line PSPL includes a major dimension which extends along the second direction (y-axis direction), the third width W3 of the first sub-power supply pad line PSPL1 may refer to a minor dimension of the first sub-power supply line SPSL1 along the first direction (x-axis direction), and the fourth width W4 of the second sub-power supply line SPSL2 may refer to a minor dimension of the second sub-power supply line SPSL2 along the first direction (x axis direction). The second sub-power supply pad line PSPL2 may cover the first sub-power supply pad line PSPL1. The second sub-power supply pad line PSPL2 may be in contact with the first sub-power supply pad line PSPL1.

The driving voltage line VDL may protrude from the second sub-power supply line SPSL2. That is, the second sub-power supply line SPSL2 may define the driving voltage line VDL. Referring to FIG. 6, for example, the driving voltage line VDL may include only the layer of the second sub-power supply line SPSL2 and may exclude the layer of the first sub-power supply line SPSL1.

The first power supply line PSL1, the first power supply pad line PSPL, the first control line CL1, the second control line CL2, the driving voltage line VDL and the common source electrode MS and the first demux drain electrode MD1 of the first demux transistor DMT1 may be disposed on the second interlayer dielectric layer 142. The common source electrode MS and the second demux drain electrode MD2 of the second demux transistor DMT2 may also be disposed on the second interlayer dielectric layer 142. That is, these elements on the second interlayer dielectric layer 142 may be in a same layer as each other.

The planarization layer 160 may be disposed on the first power supply line PSL1, the first power supply pad line PSPL, the first control line CL1, the second control line CL2, the driving voltage line VDL, the common source electrode MS and the first demux drain electrode MD1 of the first demux transistor DMT1, and the common source electrode MS and the second demux drain electrode MD2 of the second demux transistor DMT2.

The second sub-power supply line SPSL2 of the first power supply line PSL1, the second sub-power supply pad line PSPL2 of the first power supply pad line PSPL, the first control line CL1, the second control line CL2, the driving voltage line VDL, and the common source electrode MS and the first demux drain electrode MD1 of the first demux transistor DMT1 may include or be made of the same material as the anode connection electrode ANDE. That is, second sub-power supply line SPSL2, the second sub-power supply pad line PSPL2, the first control line CL1, the second control line CL2, the driving voltage line VDL and the common source electrode MS in the non-display area NDA may be in a same layer as the anode connection electrode ANDE in the display area DA.

The first sub-power supply line SPSL1 of the first power supply line PSL1 and the first sub-power supply pad line PSPL1 of the first power supply pad line PSPL may include or be made of either the same material as or a different material from the anode connection electrode ANDE. The first sub-power supply line SPSL1 of the first power supply line PSL1 and the first sub-power supply pad line PSPL1 of the first power supply pad line PSPL may include or be made of a single layer or multiple layers among molybdenum (Mo), aluminum (Al), chromium (Cr), gold (Au), titanium (Ti), nickel (Ni), neodymium (Nd) and copper (Cu) and an alloy thereof The common source electrode MS may be connected to the data fan-out line DFL through a third contact hole CT3 penetrating the first interlayer dielectric layer 141 and the second interlayer dielectric layer 142. The common source electrode MS may be connected to the common active layer MACT through a fourth contact hole CT4 penetrating the gate insulating layer 130, the first interlayer dielectric layer 141 and the second interlayer dielectric layer 142.

The first demux drain electrode MD1 may be connected to the common active layer MACT through a fifth contact hole CT5 penetrating the gate insulating layer 130, the first interlayer dielectric layer 141 and the second interlayer dielectric layer 142. The first demux drain electrode MD1 may be connected to the first data bridge DB1 through a first bridge contact hole BCT1 penetrating the first interlayer dielectric layer 141 and the second interlayer dielectric layer 142.

The power supply bridge PSB may be disposed on the planarization layer 160. The bank 180 may be disposed on the power supply bridge PSB. The power supply bridge PSB may be disposed on the same layer as the pixel electrode 171 and may include or be made of the same material.

The power supply bridge PSB may be connected to the second sub-power supply line SPSL2 of the first power supply line PSL1 through a first power connection contact hole DCT1 penetrating the planarization layer 160. The power supply bridge PSB may be connected to the second sub-power supply pad line PSPL2 of the first power supply pad line PSPL through a second power connection contact hole DCT2 penetrating the planarization layer 160.

As shown in FIGS. 6 to 8, the first power supply line PSL1 may include the first sub-power supply line SPSL1 and the second sub-power supply line SPSL2, and the first power supply pad line PSPL may include the first sub-power supply pad line PSPL1 and the second sub-power supply pad line PSPL2. In an embodiment, the first power supply line PSL1 and the first power supply pad line PSPL may have a two-layer wiring structure. Accordingly, even though the planar area of the non-display area NDA of the display device 10 is reduced and accordingly the width of the first power supply line PSL1 is reduced, increasing of electrical resistance of the first power supply line PSL1 may be reduced or effectively prevented. Therefore, suppression or prevention of an increase in deviations in electrical resistance between the driving voltage lines VDL connected to the first power supply line PSL1 is possible. Accordingly, increase of non-uniformity of the luminance of the pixels of the display device 10 may be reduced or effectively prevented.

Figure 9:
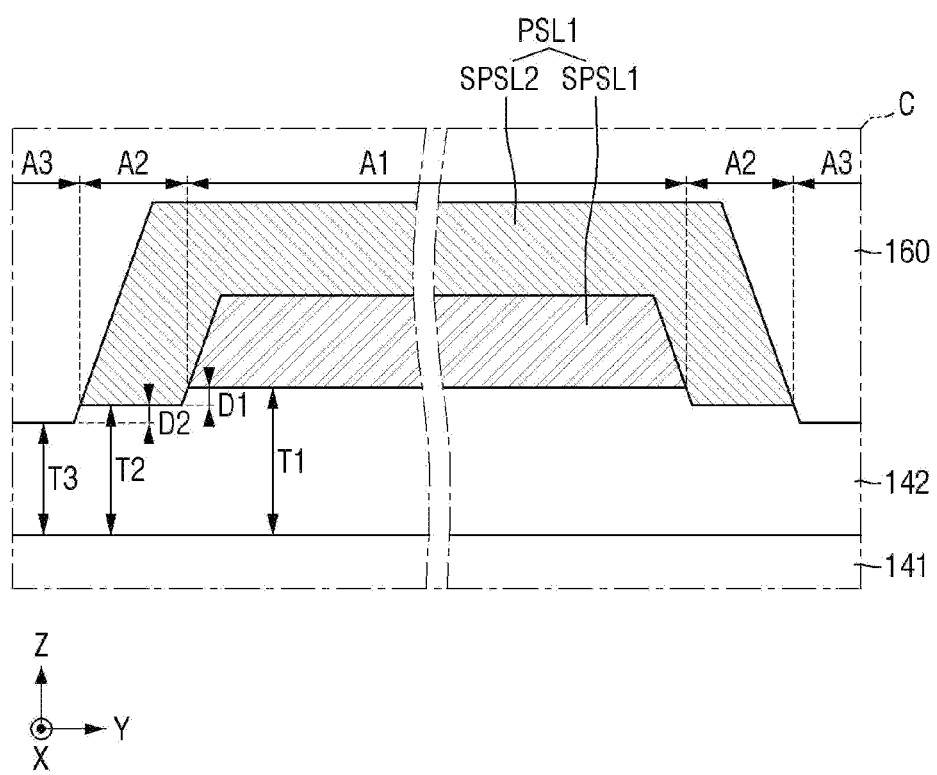
FIG. 9 is an enlarged cross-sectional view showing an embodiment of area C of FIG. 8.
Figure 10:
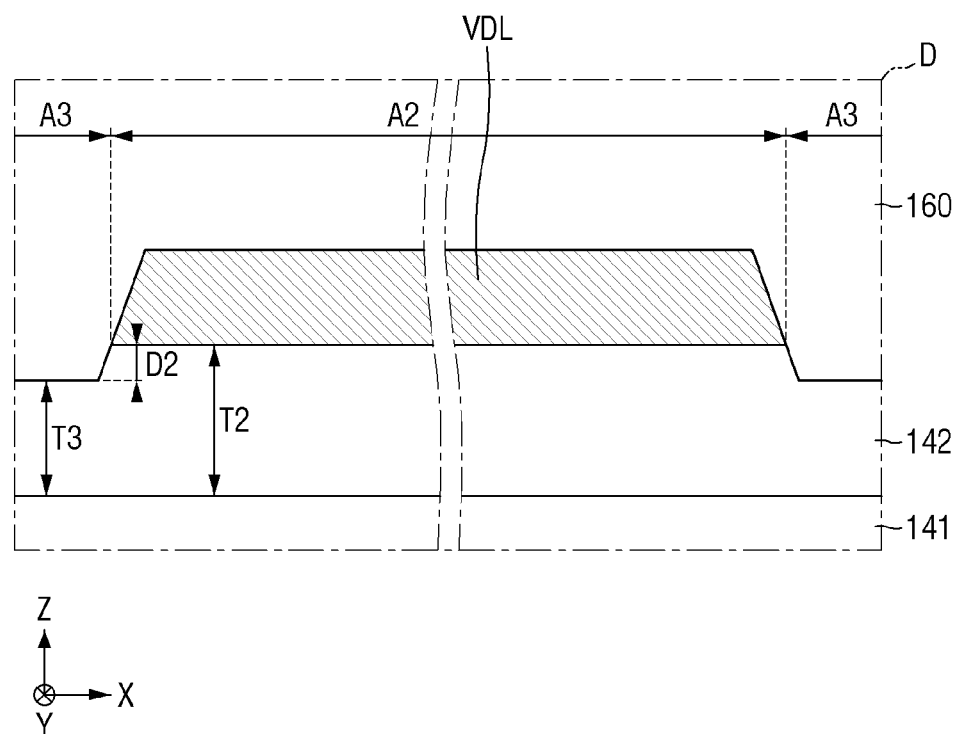
FIG. 10 is an enlarged cross-sectional view showing an embodiment of area D of FIG. 8.

FIG. 9 is an enlarged cross-sectional view showing area C of FIG. 8 in detail. FIG. 10 is an enlarged cross-sectional view showing area D of FIG. 8 in detail.

Referring to FIGS. 9 and 10, a thickness of the second interlayer dielectric layer 142 may vary in a direction along the substrate SUB. The first area A1 of the second interlayer dielectric layer 142 corresponds to a region where the second interlayer dielectric layer 142 and the first sub-power supply line SPSL1 overlap each other along the third direction (z-axis direction). The second area A2 of the second interlayer dielectric layer 142 includes a region where the second interlayer dielectric layer 142 overlaps only with the second sub-power supply line SPSL2 along the third direction (z-axis direction). The third area A3 of the second interlayer dielectric layer 142 includes a region where the second interlayer dielectric layer 142 does not overlap with the first power supply line PSL1 along the third direction (z-axis direction) since the first power supply line PSL1 is omitted at the third area A3.

The second interlayer dielectric layer 142 may have a first thickness T1 at the first area A1, a second thickness T2 at the second area A2 which is smaller than the first thickness T1, and a third thickness T3 at the third area A3 which is smaller than the second thickness T2. The thicknesses of the second interlayer dielectric layer 142 may be defined as a minimum distance from the upper surface of the first interlayer dielectric layer 141 which is furthest from the substrate SUB along the third direction (z-axis direction) to the upper surface of the second interlayer dielectric layer 142 which is furthest from the substrate SUB along the third direction (z-axis direction).

The first thickness T1 may be approximately 5,000 angstrom (Å.) A first difference D1 between the first thickness T1 and the second thickness T2 may be approximately 700 Å to 1,200 Å. A second difference D2 between the second thickness T2 and the third thickness T3 may also be approximately 700 Å to 1,200 Å. Accordingly, the second interlayer dielectric layer 142 may have a level difference, e.g., a step between the first area A1 and the second area A2 and between the second area A2 and the third area A3. The upper surface of the second interlayer dielectric layer 142 may include the stepped portions.

In an embodiment, for example, the first thickness T1 of the second interlayer dielectric layer 142 corresponding to the first sub-power supply line SPSL1 along the third direction (z-axis direction) may be larger than the second thickness T2 of the second interlayer dielectric layer 142 corresponding not with the first sub-power supply line SPSL1 but with only the second sub-power supply line SPSL2 along the third direction (z-axis direction). In addition, the second thickness T2 of the second interlayer dielectric layer 142 overlapping not with the first sub-power supply line SPSL1 but with only the second sub-power supply line SPSL2 along the third direction (z-axis direction) may be larger than the third thickness T3 along the third direction (z-axis direction) of the second interlayer dielectric layer 142 which is outside of the first power supply line PSL1 in a plan view and in a direction along the substrate SUB.

In addition, the second area A2 of the second interlayer dielectric layer 142 may further include a region where the second interlayer dielectric layer 142 overlaps with the driving voltage line VDL along the third direction (z-axis direction). The third area A3 of the second interlayer dielectric layer 142 may further include a region where the second interlayer dielectric layer 142 does not overlap with the driving voltage line VDL along the third direction (z-axis direction). That is, the third area A3 may be outside the driving voltage line VDL in a direction along the substrate SUB.

In an embodiment, for example, the second thickness T2 of the second interlayer dielectric layer 142 which corresponds to the driving voltage line VDL along the third direction (z-axis direction) may be larger than the third thickness T3 of the second interlayer dielectric layer 142 does not correspond with the driving voltage line VDL along the third direction (z-axis direction). In addition, the second thickness T2 of the second interlayer dielectric layer 142 overlapping with the driving voltage line VDL along the third direction (z-axis direction) may be smaller than the first thickness T1 of the second interlayer dielectric layer 142 overlapping with the first sub-power supply line SPSL1 along the third direction (z-axis direction). In addition, the second thickness T2 of the second interlayer dielectric layer 142 overlapping with the driving voltage line VDL along the third direction (z-axis direction) (FIG. 10) may be smaller than the second thickness T2 of the second interlayer dielectric layer 142 overlapping not with the first sub-power supply line SPSL1 but with the second sub-power supply line SPSL2 along the third direction (z-axis direction) (FIG. 9). In addition, the third thickness T3 of the second interlayer dielectric layer 142 not overlapping with the driving voltage line VDL along the third direction (z-axis direction) (FIG. 10) may be substantially equal to the third thickness T3 of the second interlayer dielectric layer 142 not overlapping with the first power supply line PSL1 along the third direction (z-axis direction) (FIG. 9).

Furthermore, the second area A2 of the second interlayer dielectric layer 142 further includes regions where the second interlayer dielectric layer 142 overlaps along the third direction (z-axis direction) with the anode connection electrode ANDE (see FIG. 5), the first control line CL1 (see FIG. 6), the second control line CL2 (see FIG. 6), the common source electrode MS (see FIG. 6), the first demux drain electrode MD1 (see FIG. 6) and the second demux drain electrode MD2 (see FIG. 5) which are provided or formed in a same layer such as to include of a same material as the driving voltage line VDL. The third area A3 of the second interlayer dielectric layer 142 further includes regions where the second interlayer dielectric layer 142 does not overlap along the third direction (z-axis direction) with the anode connection electrode ANDE (see FIG. 5), the first control line CL1 (see FIG. 6), the second control line CL2 (see FIG. 6), the common source electrode MS (see FIG. 6), the first demux drain electrode MD1 (see FIG. 6) and the second demux drain electrode MD2 (see FIG. 5).

The thicknesses of the second interlayer dielectric layer 142 in the first to third areas A1, A2 and A3 will be further described with reference to FIGS. 26 to 37.

Figure 11:
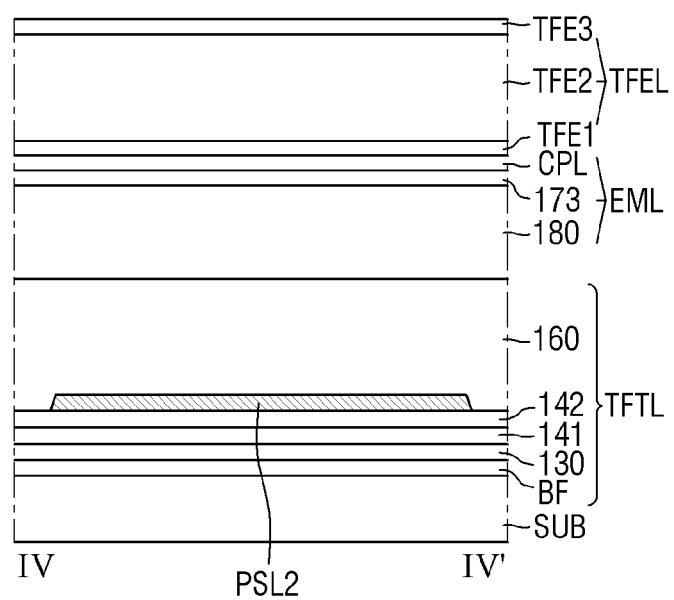
FIG. 11 is a cross-sectional view showing an embodiment of the display panel taken along line VI-VI' of FIG. 4.

FIG. 11 is an enlarged cross-sectional view showing an embodiment of the display panel 100 taken along line VI-VI' of FIG. 4.

Referring to FIG. 11, the second power supply line PSL2 may be disposed on the second interlayer dielectric layer 142. The planarization layer 160 may be disposed on the second power supply line PSL2. The second power supply line PSL2 may include or be made of the same material as the anode connection electrode ANDE, the second sub-power supply line SPSL2 of the first power supply line PSL1, the second sub-power supply pad line PSPL2 of the first power supply pad line PSPL, the first control line CL1, the second control line CL2, the driving voltage line VDL, and the common source electrode MS and the first demux drain electrode MD1 of the first demux transistor DMT1. The second power supply line PSL2 may include or be made of either the same material as or a different material from the first sub-power supply line SPSL1 of the first power supply line PSL1 and the first sub-power supply pad line PSPL1 of the first power supply pad line PSPL.

As shown in FIG. 11, when the second power supply line PSL2 is disposed on the second interlayer dielectric layer 142 as a single layer, the thickness of the second interlayer dielectric layer 142 corresponding to the second power supply line PSL2 along the third direction (z-axis direction) may be substantially equal to the second thickness T2 of the second interlayer dielectric layer 142 corresponding to the driving voltage line VDL along the third direction (z-axis direction) as in FIG. 10.

Figure 12:
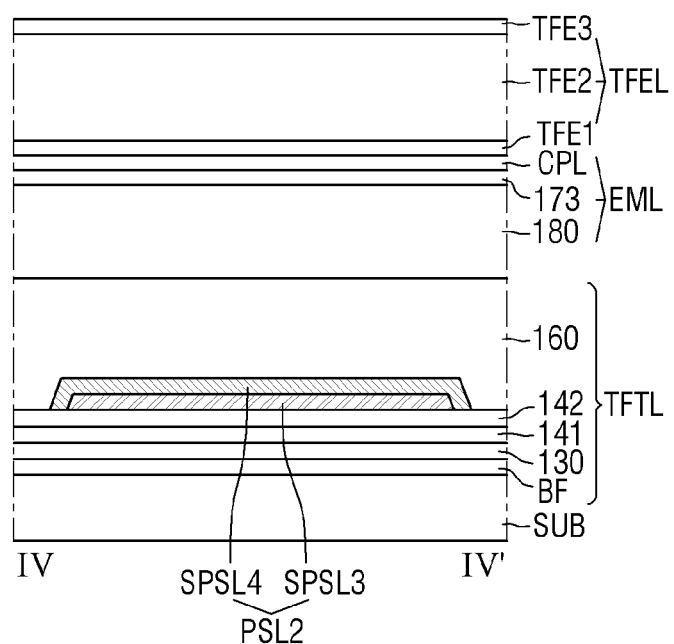
FIG. 12 is a cross-sectional view showing an embodiment of the display panel taken along line VI-VI' of FIG. 4.

FIG. 12 is an enlarged cross-sectional view showing an embodiment of the display panel 100 taken along line VI-VI' of FIG. 4.

Referring to FIG. 12, the second power supply line PSL2 may include a third sub-power supply line SPSL3 and a fourth sub-power supply line SPSL4. The fourth sub-power supply line SPSL4 may be disposed on the third sub-power supply line SPSL3. The fourth sub-power supply line SPSL4 may be extended along the upper side and the side surfaces of the third sub-power supply line SPSL3.

In a direction along the second interlayer dielectric layer 142, the width of the fourth sub-power supply line SPSL4 may be larger than the width of the third sub-power supply line SPSL3. The fourth sub-power supply line SPSL4 may cover the third sub-power supply line SPSL3. The fourth sub-power supply line SPSL4 may be in contact with the third sub-power supply line SPSL3.

As shown in FIG. 12, when the second power supply line PSL2 has the two-layer wiring structure, the thickness of the second interlayer dielectric layer 142 which corresponds to the third sub-power supply line SPSL3 of the second power supply line PSL2 along the third direction (z-axis direction) may be substantially equal to the first thickness T1 of the second interlayer dielectric layer 142 corresponding to the first sub-power supply line SPSL1 of the first power supply line PSL1 along the third direction (z-axis direction) as in FIG. 9. In addition, the thickness of the second interlayer dielectric layer 142 overlapping not with the third sub-power supply line SPSL3 but with the fourth sub-power supply line SPSL4 along the third direction (z-axis direction) may be substantially equal to the second thickness T2 of the second interlayer dielectric layer 142 overlapping not with the first sub-power supply line SPSL1 but with the second sub-power supply line SPSL2 along the third direction (z-axis direction).

In addition, as shown in FIG. 12, when the second power supply line PSL2 has the two-layer wiring structure, even though the planar area of the non-display area NDA of the display device 10 is reduced and accordingly the width of the second power supply line PSL1 is reduced, increasing of the electrical resistance of the second power supply line PSL1 may be reduced or effectively prevented. Therefore, deviations in electrical resistance of the second supply voltage applied to the second power supply line PSL2 may be reduced or effectively prevented.

Figure 13:
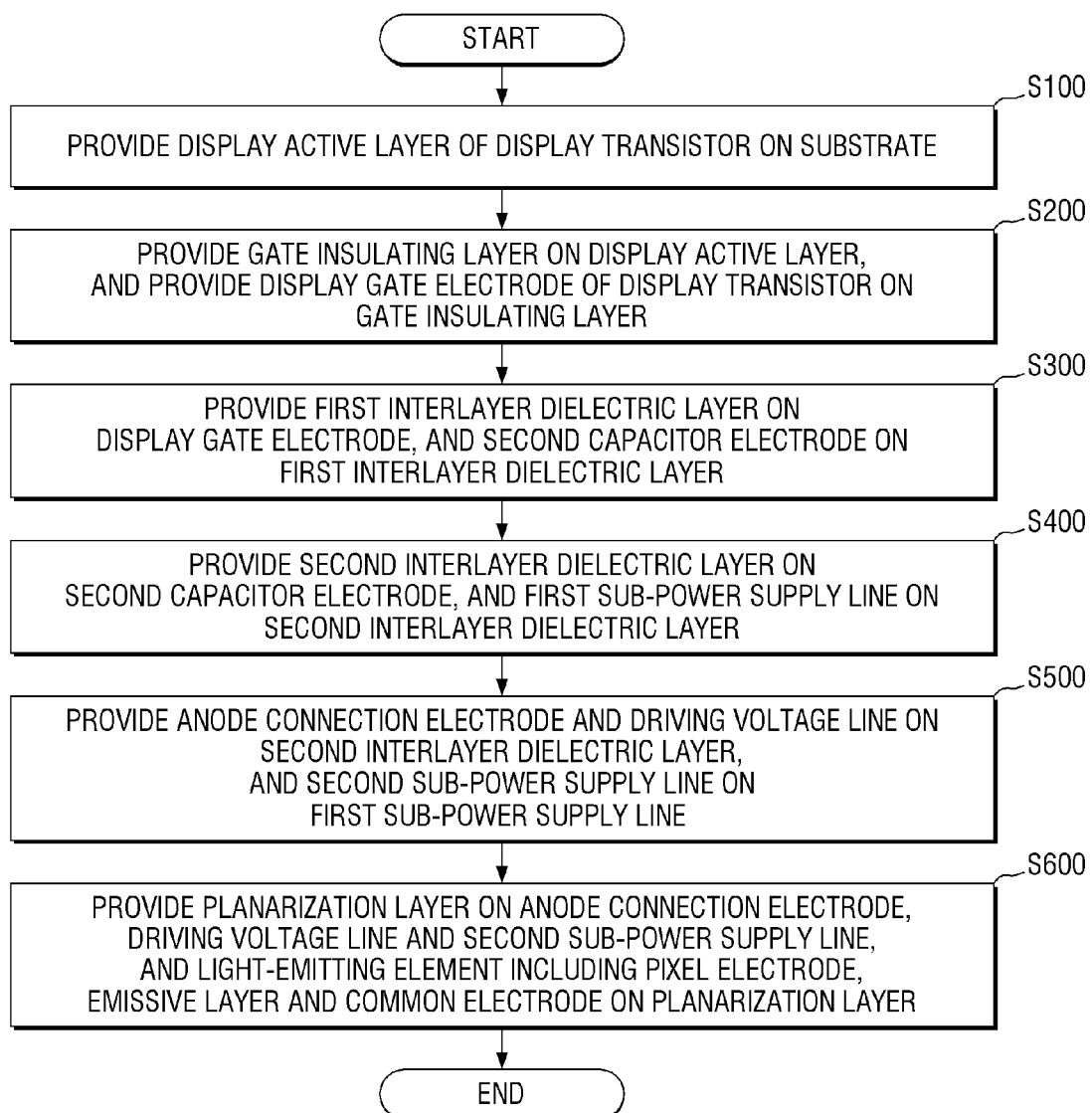
FIG. 13 is a flowchart for illustrating an embodiment of a method of providing a display device.

FIG. 13 is a flowchart for illustrating an embodiment of a method of providing or fabricating a display device 10. FIGS. 14 to 25 are cross-sectional views for illustrating embodiments of structures in the method of provided or fabricating a display device 10.

Figure 14:
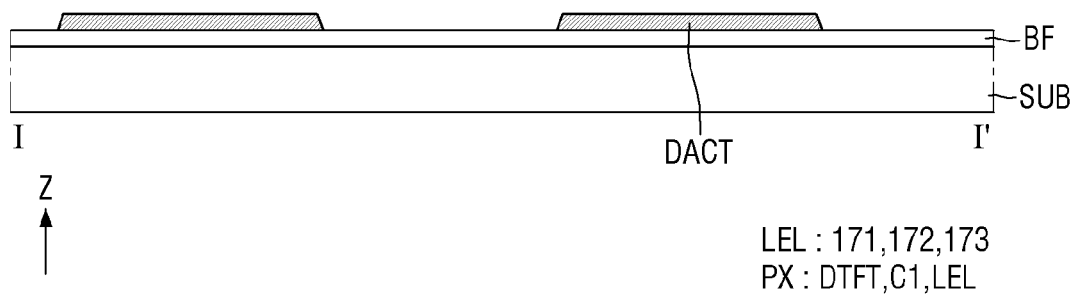
FIGS. 14 to 25 are enlarged cross-sectional views for illustrating an embodiment of the method of providing a display device.
Figure 15:
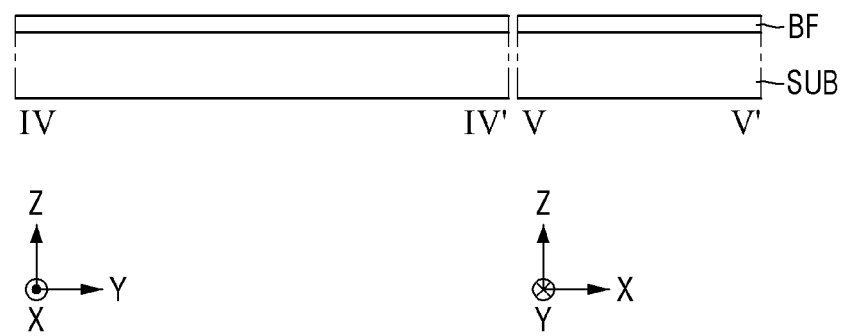

As shown in FIGS. 14 and 15, a buffer layer BF is provided or formed on a substrate SUB, and a display active layer DACT of a display transistor DTFT is provided or formed on the buffer layer BF (S100 of FIG. 13).

Specifically, the buffer layer BF is provided or formed by depositing an inorganic material on the substrate SUB. Subsequently, the display active layer DACT and a common active layer MACT (see FIG. 6) of the first demux transistor DMT1 (see FIG. 6) and a second demux transistor DMT2 (see FIG. 4) are provided or formed on the buffer layer BF such as by using a photolithography process. In an embodiment, the display active layer DACT and the common active layer MACT (see FIG. 6) of the first demux transistor DMT1 (see FIG. 6) and the second demux transistor DMT2 (see FIG. 4) may be provided or formed simultaneously.

Figure 16:
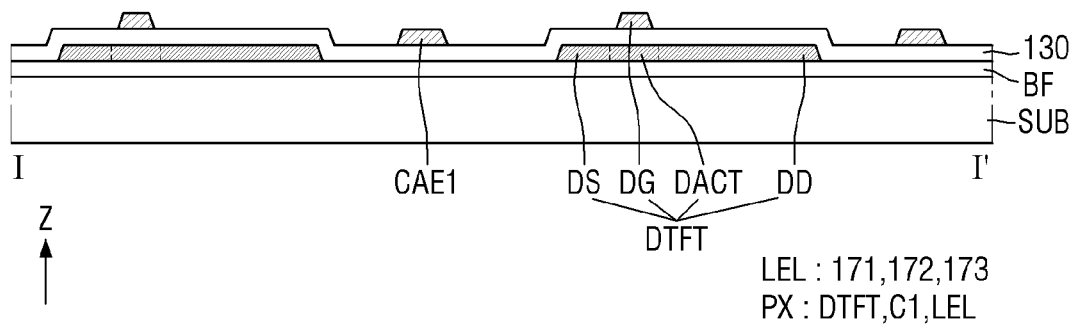
Figure 17:
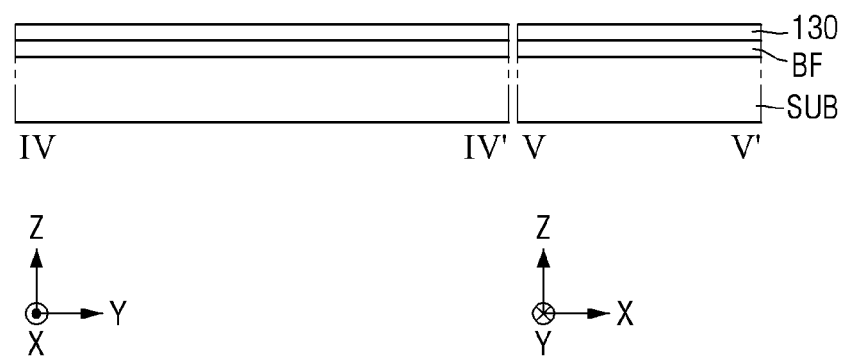

As shown in FIGS. 16 and 17, a gate insulating layer 130 is provided or formed on the display active layer DACT, and a display gate electrode DG of the display transistor DTFT is provided or formed on the gate insulating layer 130 (S200 of FIG. 13).

Specifically, the gate insulating layer 130 is provided or formed by depositing an inorganic material on the display active layer DACT. Subsequently, the display gate electrode DG, a first capacitor electrode CAE1, a first demux gate electrode MG1 of the first demux transistor DMT1 (see FIG. 6), and a second demux gate electrode MG2 of the second demux transistor DMT2 (see FIG. 4) are provided or formed on the gate insulating layer 130 such as by using a photolithography process. In an embodiment, the display gate electrode DG, the first capacitor electrode CAE1, the first demux gate electrode MG1 of the first demux transistor DMT1 (see FIG. 6) and the second demux gate electrode MG2 of the second demux transistor DMT2 (see FIG. 4) may be provided or formed simultaneously.

Portions of the display active layer DACT may be doped with ions or impurities to have electrical conductivity. Accordingly, the display source electrode DS and the display drain electrode DD having electrical conductivity may be provided or formed.

Figure 18:
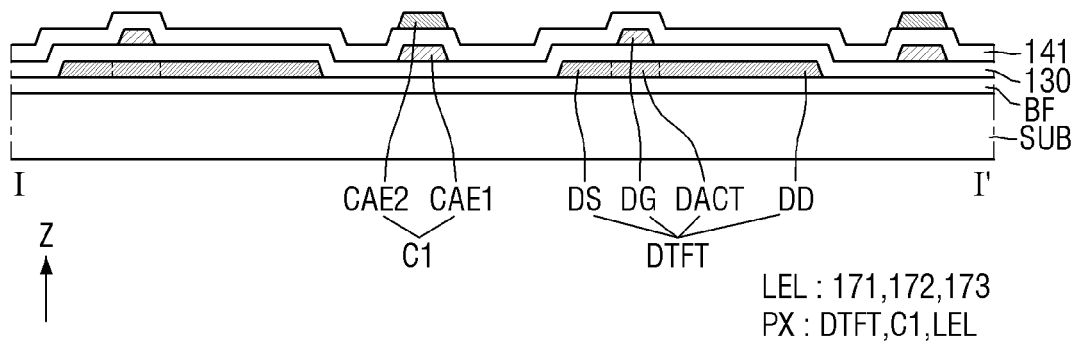
Figure 19:
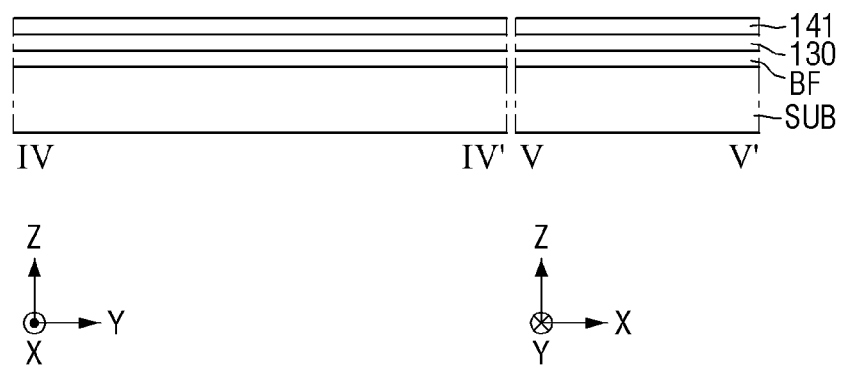

As shown in FIGS. 18 and 19, a first interlayer dielectric layer 141 is provided or formed on the display gate electrode DG, and a second capacitor electrode CAE2 is provided or formed on the first interlayer dielectric layer 141 (S300 of FIG. 13).

Specifically, the first interlayer dielectric layer 141 is provided or formed by depositing an inorganic material on the display gate electrode DG. Subsequently, the second capacitor electrode CAE2 is provided or formed on the first interlayer dielectric layer 141 such as by using a photolithography process.

Figure 20:
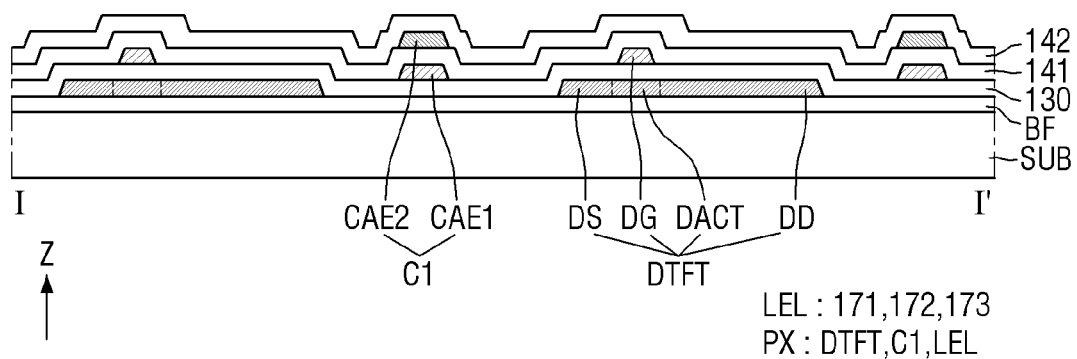
Figure 21:
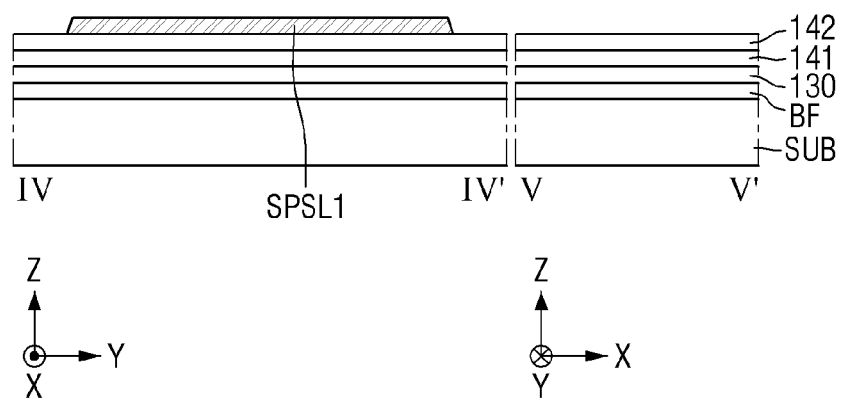

As shown in FIGS. 20 and 21, a second interlayer dielectric layer 142 is provided or formed on the second capacitor electrode CAE2, and the first sub-power supply line SPSL1 of the first power supply line PSL1 is provided or formed on the second interlayer dielectric layer 142 (S400 of FIG. 13).

Specifically, an inorganic material is deposited on the second capacitor electrode CAE2 to provided or form the second interlayer dielectric layer 142. Subsequently, the first sub-power supply line SPSL1 of the first power supply line PSL1 and the first sub-power supply pad line PSPL1 (see FIG. 7) of the first power supply pad line PSPL (see FIG. 7) are provided or formed on the second interlayer dielectric layer 142 such as by using a photolithography process.

In addition, when the second power supply line PSL2 has the two-layered wiring structure including the third sub-power supply line SPSL3 and the fourth sub-power supply line SPSL4 as shown in FIG. 12, the third sub-power supply line SPSL3 (see FIG. 12) may be provided or formed simultaneously with the first sub-power supply line SPSL1 of the first power supply line PSL1 and the first sub-power supply pad line PSPL1 (see FIG. 7) of the first power supply pad line PSPL (see FIG. 7).

The providing of the second interlayer dielectric layer 142, the first sub-power supply line SPSL1 and the second power supply line PSL2 (S400 of FIG. 13) will be described in more detail with reference to FIGS. 26 to 32.

Figure 22:
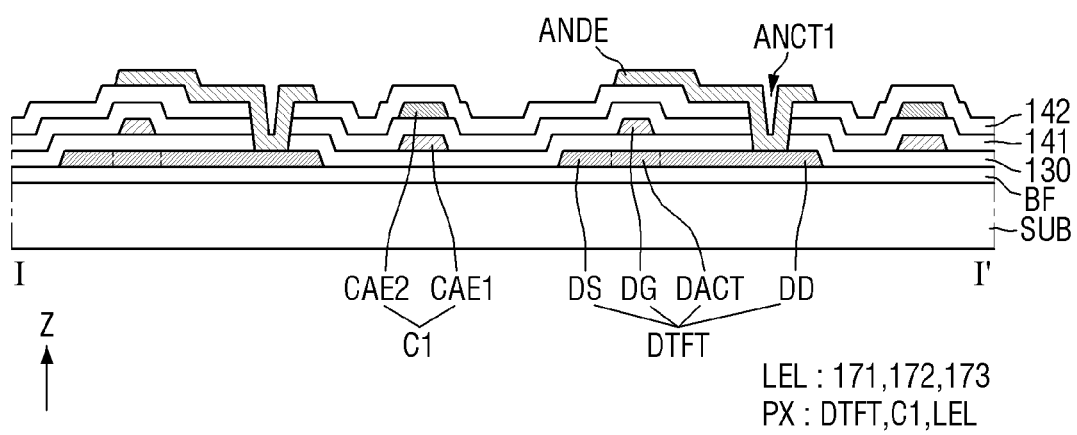
Figure 23:
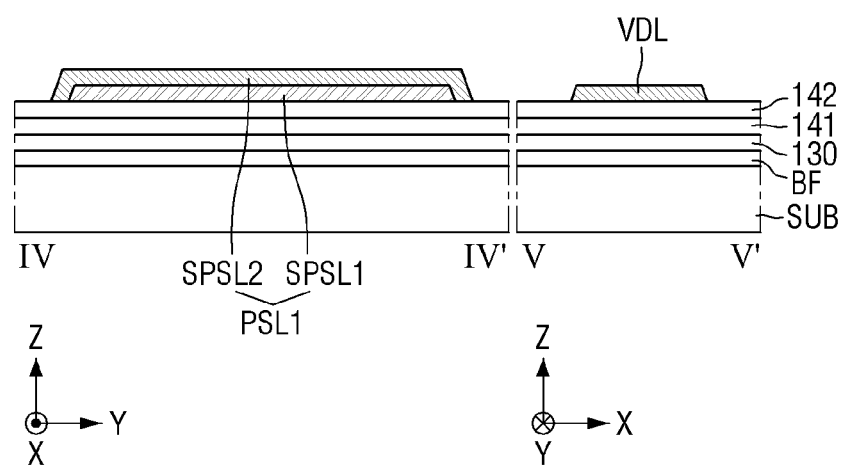

As shown in FIGS. 22 and 23, an anode connection electrode ANDE and a driving voltage line VDL are provided or formed on the second interlayer dielectric layer 142, and at the same time, the second sub-power supply line SPSL2 is provided or formed on the first sub-power supply line SPSL1 (S500 of FIG. 13).

Specifically, the anode connection electrode ANDE, the driving voltage line VDL, a first demux drain electrode MD1 (see FIG. 6) of the first demux transistor DMT1 (see FIG. 6), a second demux drain electrode MD2 (see FIG. 5) of the second demux transistor DMT2 (see FIG. 4) and a common source electrode MS are provided or formed on the second interlayer dielectric layer 142 such as using a photolithography process, a second sub-power supply line SPSL2 is provided or formed on the first sub-power supply line SPSL1, and a second sub-power supply pad line PSPL2 is provided or formed on the first sub-power supply pad line PSPL1.

In addition, when the second power supply line PSL2 has the two-layer wiring structure including the third sub-power supply line SPSL3 and the fourth sub-power supply line SPSL4 as shown in FIG. 12, the fourth sub-power supply line SPSL4 may be provided or formed simultaneously with the second sub-power supply line SPSL2 of the second power supply line PSL2 and the second sub-power supply pad line PSPL2 of the second power supply pad line PSPL.

The providing of the anode connection electrode ANDE, the driving voltage line VDL and the second sub-power supply line SPSL2 (S500 of FIG. 13) will be described in more detail with reference to FIGS. 33 to 37.

Figure 24:
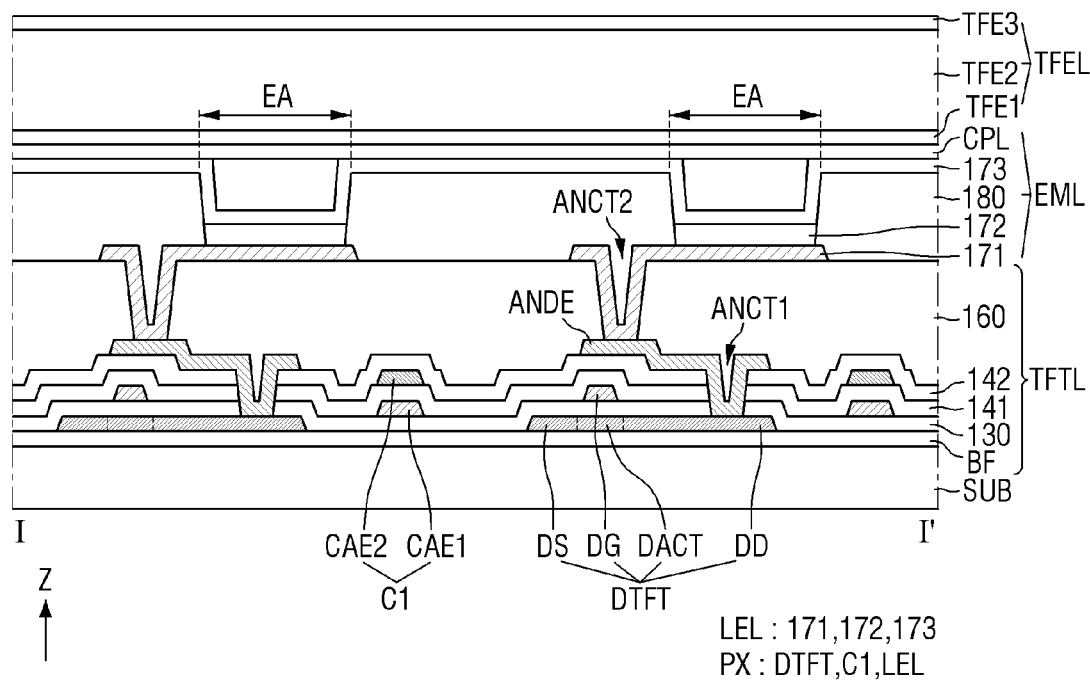
Figure 25:
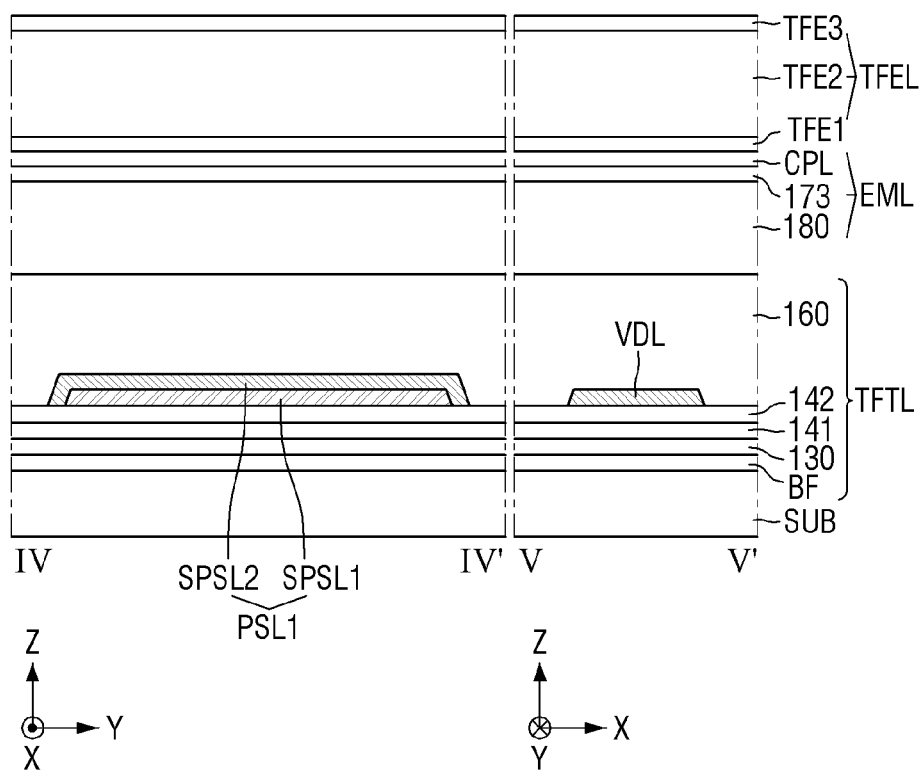

As shown in FIGS. 24 and 25, a planarization layer 160 is provided or formed on the anode connection electrode ANDE, the driving voltage line VDL and the second sub-power supply line SPSL2, and a light-emitting element LEL including a pixel electrode 171, an emissive layer 172 and a common electrode 173 is provided or formed on the planarization layer 160 (S600 of FIG. 13).

Specifically, an organic material is deposited on the anode connection electrode ANDE, the driving voltage line VDL, the second sub-power supply line SPSL2, the first demux drain electrode MD1 (see FIG. 6) of the first demux transistor DMT1 (see FIG. 6), the second demux drain electrode MD2 (see FIG. 5) of the second demux transistor DMT2 (see FIG. 4) and the common source electrode MS, to provide or form the planarization layer 160. Subsequently, the pixel electrode 171 is provided or formed on the planarization layer 160 such as by using a photolithography process. Subsequently, a bank 180 is provided or formed on the pixel electrode 171 such as by using a photolithography process. Subsequently, the emissive layer 172 is provided or formed on the bank 180 such as by using a deposition process using a mask. Subsequently, the common electrode 173 is provided or formed on the emissive layer 172 such as by using a photolithography process.

An inorganic material is deposited on the common electrode 173 to provide or form a first inorganic layer TFE1 of an encapsulation layer TFEL. Subsequently, an organic material is deposited on the first inorganic layer TFE1 to provide or form an organic layer TFE2 of the encapsulation layer TFEL. Subsequently, an inorganic material is deposited on the organic layer TFE2 to provide or form a second inorganic layer TFE3 of the encapsulation layer TFEL.

As shown in FIGS. 13 to 25, the first power supply line PSL1 may include the first sub-power supply line SPSL1 and the second sub-power supply line SPSL2, and the first power supply pad line PSPL (see FIG. 7) may include the first sub-power supply pad line PSPL1 (see FIG. 7) and the second sub-power supply pad line PSPL2 (see FIG. 7). In an embodiment, the first power supply line PSL1 and the first power supply pad line PSPL (see FIG. 7) may have a two-layer wiring structure. Accordingly, even though the planar area of the non-display area NDA of the display device 10 is reduced and accordingly the width of the first power supply line PSL1 is reduced, increasing of the electrical resistance of the first power supply line PSL1 is reduced or effectively prevented. Therefore, increasing of electrical resistance between the driving voltage lines VDL connected to the first power supply line PSL1 is suppressed or effectively prevented. Accordingly, non-uniformity of the luminance of the pixels of the display device 10 may be suppressed or effectively prevented.

Figure 26:
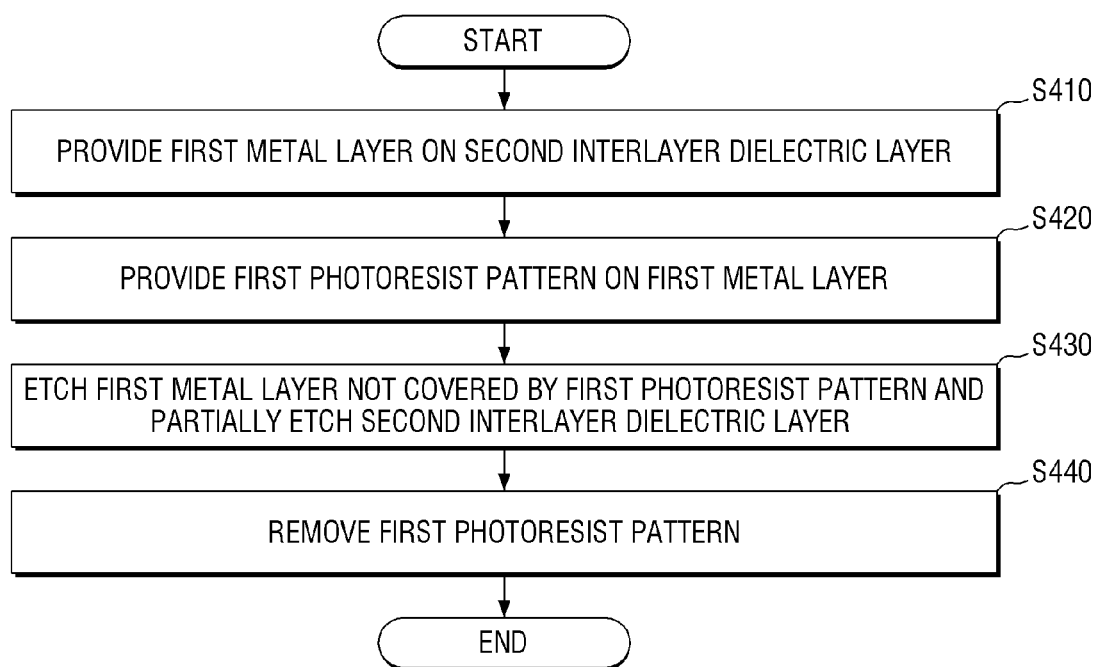
FIG. 26 is a flowchart for illustrating an embodiment of a process of FIG. 13.

FIG. 26 is a flowchart for illustrating an embodiment of S400 of FIG. 13 in detail. FIGS. 27 to 32 are enlarged cross-sectional views for illustrating S400 of FIG. 13.

Figure 27:
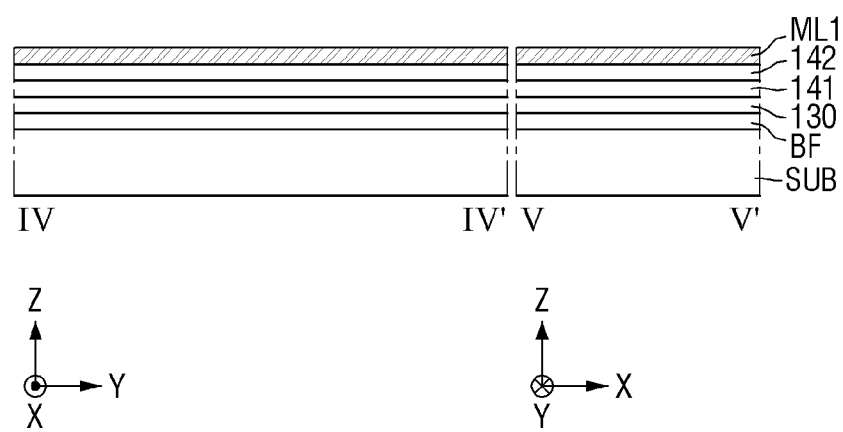
FIGS. 27 to 32 are enlarged cross-sectional views for illustrating an embodiment of a process of FIG. 13.

As shown in FIG. 27, the first metal layer ML1 is provided on an entirety of the second interlayer dielectric layer 142 (S410 of FIG. 26).

The first metal layer ML1 may include or be made of a single layer or multiple layers among molybdenum (Mo), aluminum (Al), chromium (Cr), gold (Au), titanium (Ti), nickel (Ni), neodymium (Nd) and copper (Cu) and an alloy thereof.

Figure 28:
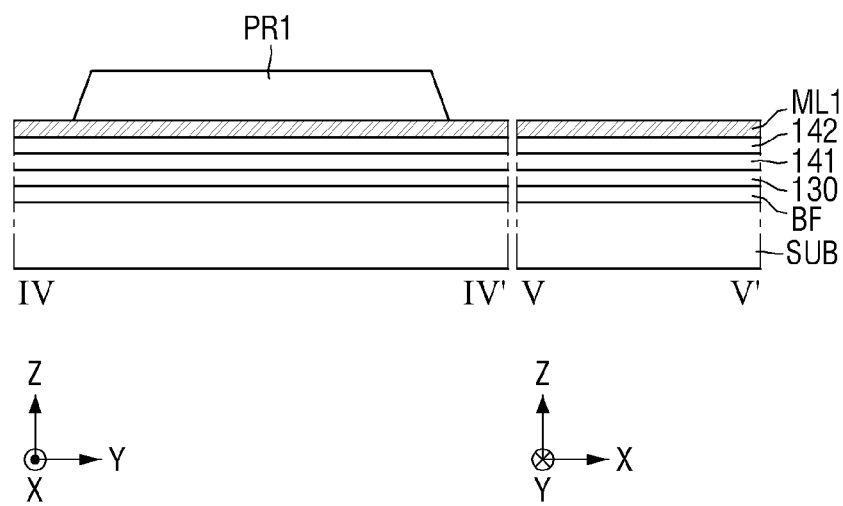

As shown in FIG. 28, a first photoresist pattern PR1 is provided or formed on the first metal layer ML1 (S420 of FIG. 26). The first photoresist pattern PR1 may correspond to the first sub-power supply line SPSL1, the third sub-power supply line SPSL3 and the first sub-power supply pad line PSPL1.

The first photoresist pattern PR1 may be provided or formed by providing a photoresist material on an entirety of the first metal layer ML1 and then exposing and developing the photoresist material using a mask. The photoresist material may be a photosensitive resin. The photoresist material may be either of a positive type, i.e., a portion exposed to light is removed by a developer, or of a negative type, e.g., a portion not exposed to light is removed by a developer.

Figure 29:
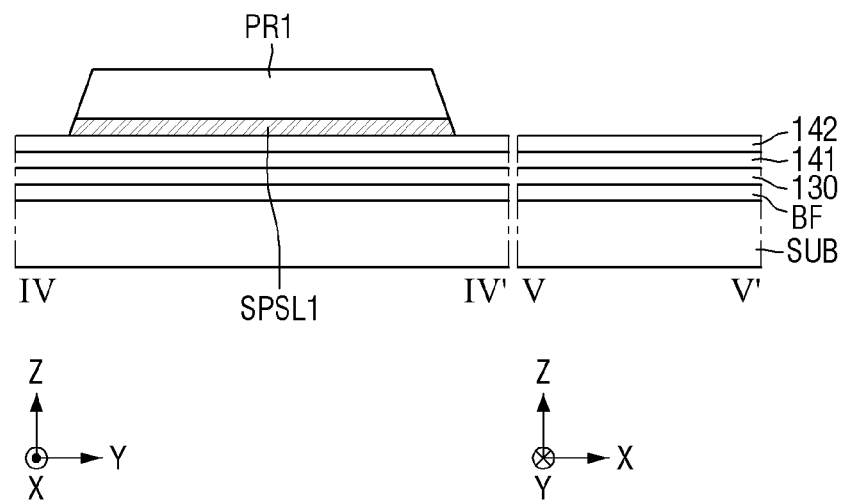

As shown in FIG. 29, the portion of the first metal layer ML1 that is not covered by the first photoresist pattern PR1 (e.g., is exposed outside the first photoresist pattern PR1) is etched out, and the second interlayer dielectric layer 142 is partially etched (S430 of FIG. 26).

Specifically, the portion of the first metal layer ML1 that is not covered by the first photoresist pattern PR1 is etched out via a wet etching process or a dry etching process. In doing so, a portion of the second interlayer dielectric layer 142 that is exposed as the first metal layer ML1 is removed may be etched out to form stepped portions at an upper surface of the second interlayer dielectric layer 142.

Figure 30:
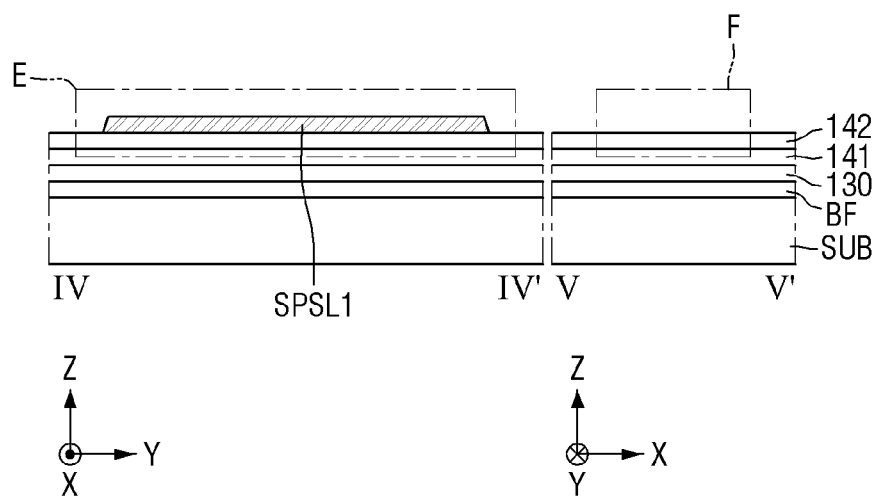

As shown in FIG. 30, the first photoresist pattern PR1 is removed to complete the first sub-power supply line SPSL1 (S440 of FIG. 26).

Incidentally, as described in 5430 of FIG. 26, while the portion of the second interlayer dielectric layer 142 is not etched in the region corresponding to the first sub-power supply line SPSL1, in the region non-corresponding with the first sub-power supply line SPSL1 formed, not only is the first metal layer ML1 etched but a thickness portion of the second interlayer dielectric layer 142 that is exposed outside of the first metal layer ML1 is also etched and removed. In such case, the second interlayer dielectric layer 142 may be etched to approximately 700 Å to 1,200 Å.

Figure 31:
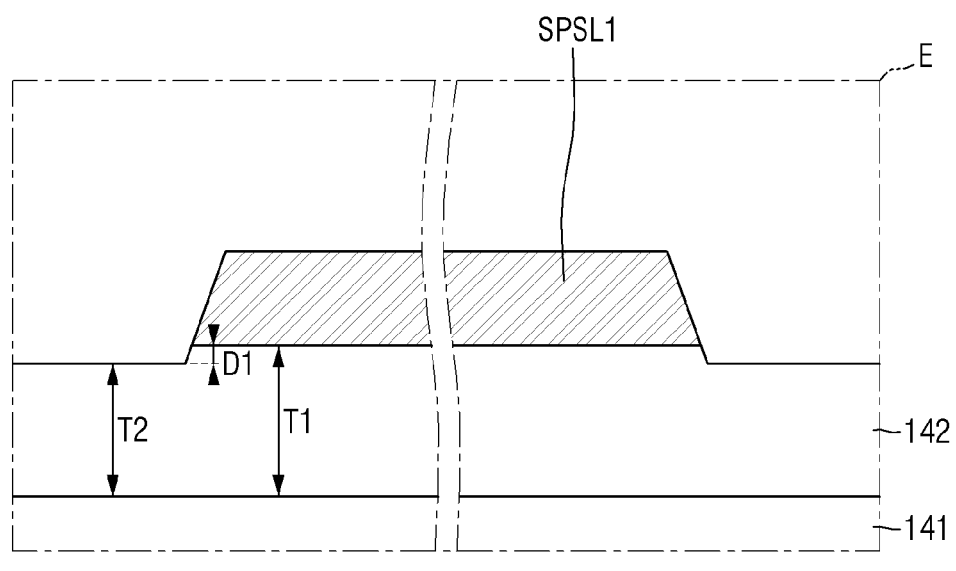
Figure 32:
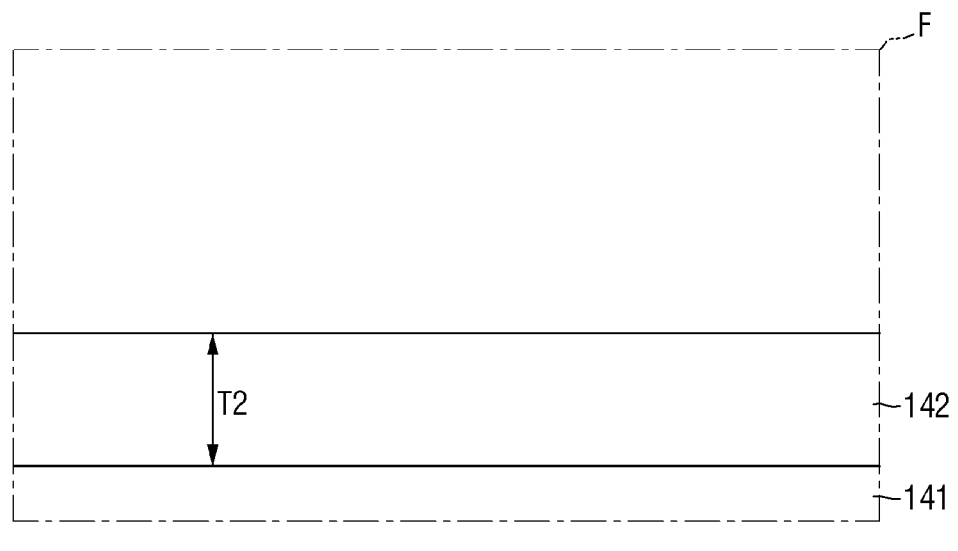

As shown in FIGS. 31 and 32, the first thickness T1 of the second interlayer dielectric layer 142 at the first sub-power supply line SPSL1 along the third direction (z-axis direction) may be larger than the second thickness T2 of the second interlayer dielectric layer 142 outside of the first sub-power supply line SPSL1 along the third direction (z-axis direction). That is, the first difference D1 between the first thickness T1 and the second thickness T2 may be approximately 700 Å to 1,200 Å.

Figure 33:
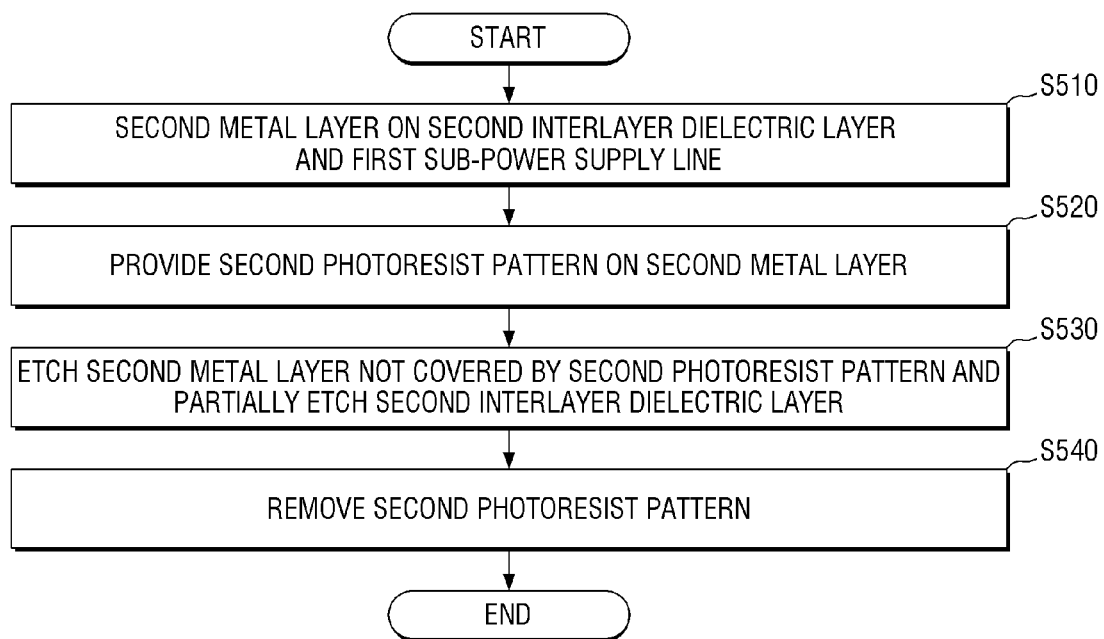
FIG. 33 is a flowchart for illustrating an embodiment of a process of FIG. 13.

FIG. 33 is a flowchart for illustrating an embodiment of S500 of FIG. 13 in detail. FIGS. 34 to 37 are enlarged cross-sectional views for illustrating S500 of FIG. 13.

Figure 34:
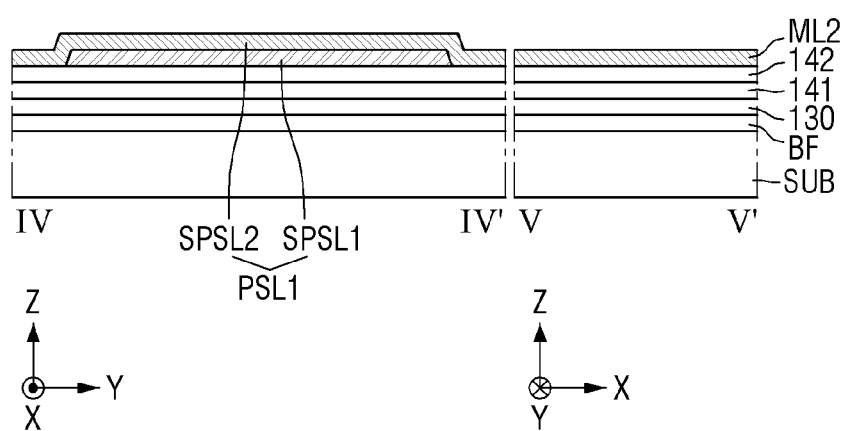
FIGS. 34 to 37 are cross-sectional views for illustrating an embodiment of a process of FIG. 13.

As shown in FIG. 34, a second metal layer ML2 is provided on an entirety of the second interlayer dielectric layer 142 and the first sub-power supply line SPSL1 (S510 of FIG. 33).

The second metal layer ML2 may include or be made of a single layer or multiple layers among molybdenum (Mo), aluminum (Al), chromium (Cr), gold (Au), titanium (Ti), nickel (Ni), neodymium (Nd) and copper (Cu) and an alloy thereof. The second metal layer ML2 may include or be made of either the same material as or a different material from that of the first metal layer ML1.

Figure 35:
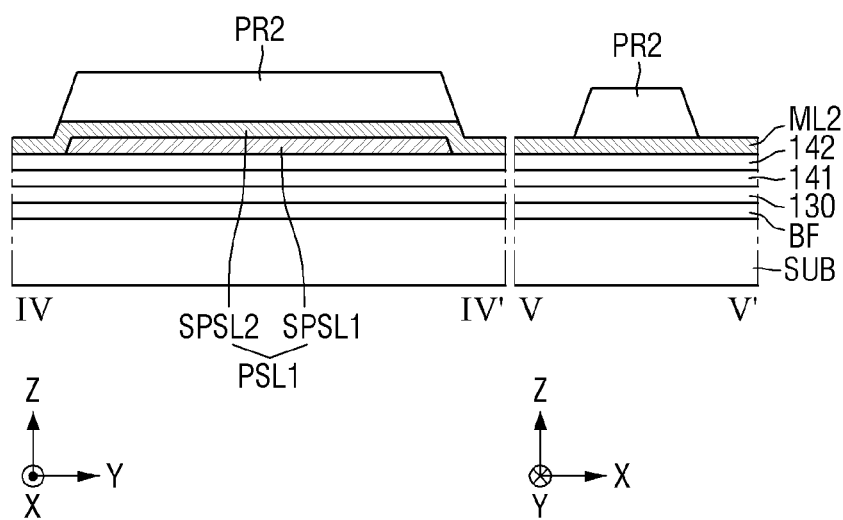

As shown in FIG. 35, a second photoresist pattern PR2 is provided or formed on the second metal layer ML2 (S520 of FIG. 33). The second photoresist pattern PR2 may correspond to the driving voltage line VDL, the second sub-power supply line SPSL2, the fourth sub-power supply line SPSL4, the second sub-power supply pad line PSPL2, the first demux drain electrode MD1, the second demux drain electrode MD2 and the common source electrode MS.

The second photoresist pattern PR2 may be provided or formed by providing a photoresist material on an entirety of the second metal layer ML2 and then exposing and developing the photoresist material using a mask.

Figure 36:
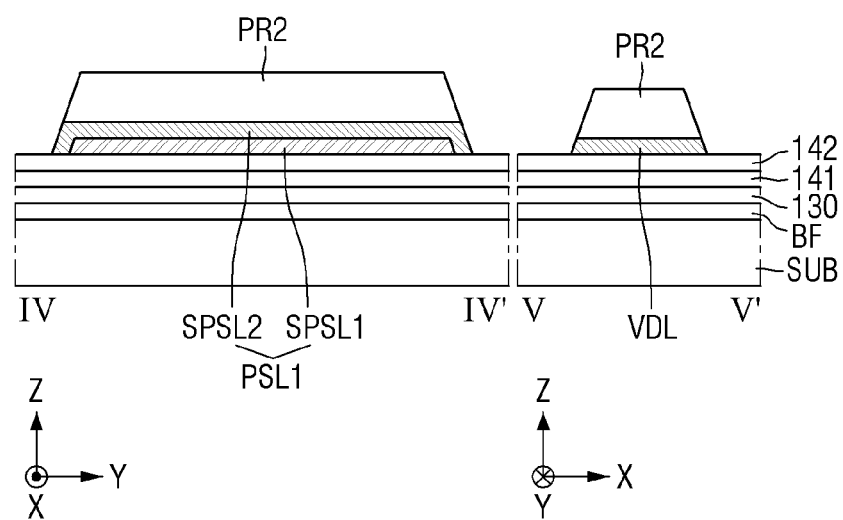

As shown in FIG. 36, the portion of the second metal layer ML2 that is not covered by the second photoresist pattern PR2 (e.g. is exposed outside the second photoresist pattern PR2) is etched out and removed, and the second interlayer dielectric layer 142 is partially etched (S530 of FIG. 330).

Specifically, the portion of the second metal layer ML2 that is not covered by the second photoresist pattern PR2 is etched out such as by a wet etching process or a dry etching process. In doing so, a thickness portion of the second interlayer dielectric layer 142 that is exposed outside of the second photoresist pattern PR2 is removed as the second metal layer ML2 is etched out.

Figure 37:
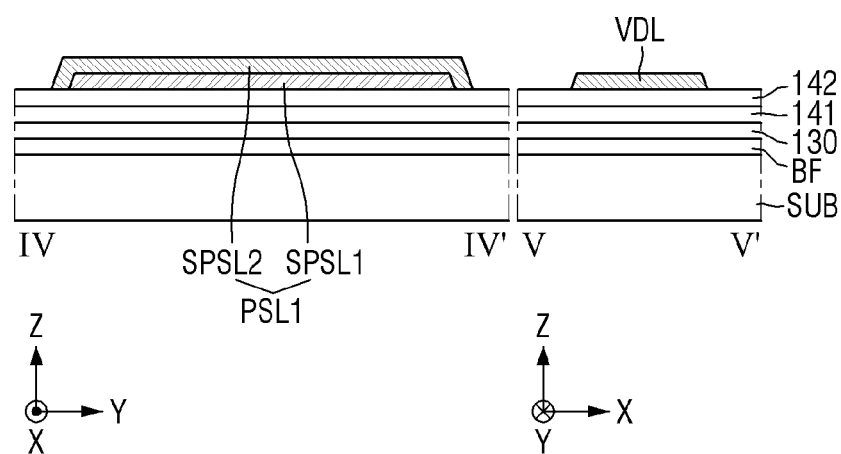

As shown in FIG. 37, the second photoresist pattern PR2 is removed to complete the second sub-power supply line SPSL2 and the driving voltage line VDL (S540 of FIG. 33).

Incidentally, as described in 5530 of FIG. 33, while the portion of the second interlayer dielectric layer 142 is not etched in the region corresponding to the second sub-power supply line SPSL2 and the driving voltage line VDL, in the region where the second sub-power supply line SPSL2 and the driving voltage line VDL are excluded or omitted, not only is the second metal layer ML2 etched but the portion of the second interlayer dielectric layer 142 that is exposed to outside a photoresist pattern is etched at a same time the second metal layer ML2 is removed. In such case, the second interlayer dielectric layer 142 may be etched to approximately 700 Å to 1,200 Å.

The portion of the second interlayer dielectric layer 142 overlapping the first sub-power supply line SPSL1 along the third direction (z-axis direction) is non-etched during the process of providing the first sub-power supply line SPSL1 (FIGS. 29-31). In contrast, the portion of the second interlayer dielectric layer 142 corresponding to the second sub-power supply line SPSL2 along the third direction (z-axis direction) is etched once (FIGS. 29-31). In addition, the portion of the second interlayer dielectric layer 142 that does not overlap with either of the first sub-power supply line SPSL1 or the second sub-power supply line SPSL2 along the third direction (z-axis direction) is etched twice (FIGS. 29-31 and FIG. 36) during processes which provide the first sub-power supply line SPSL1 (FIGS. 29-31) and the second sub-power supply line SPSL2 (FIG. 36), respectively. Therefore, the first thickness T1 of the second interlayer dielectric layer 142 corresponding to the first sub-power supply line SPSL1 along the third direction (z-axis direction) may be larger than the second thickness T2 of the second interlayer dielectric layer 142 corresponding to ends of the second sub-power supply line SPSL2 along the third direction (z-axis direction) (FIG. 9). In addition, the second thickness T2 of the second interlayer dielectric layer 142 corresponding to the second sub-power supply line SPSL2 along the third direction (z-axis direction) may be larger than the third thickness T3 of the second interlayer dielectric layer 142 non-overlapping with both the first sub-power supply line SPSL1 and the second sub-power supply line SPSL2 along the third direction (z-axis direction) (FIG. 9).

In addition, the portion of the second interlayer dielectric layer 142 that corresponds to the driving voltage line VDL along the third direction (z-axis direction) is etched once (FIGS. 29-31). In contrast, the portion of the second interlayer dielectric layer 142 that does not overlap the driving voltage line VDL along the third direction (z-axis direction) is etched twice (FIGS. 29-31 and FIG. 36). Accordingly, the second thickness T2 of the second interlayer dielectric layer 142 corresponding to the driving voltage line VDL along the third direction (z-axis direction) may be larger than the third thickness T3 of the second interlayer dielectric layer 142 not overlapping with the driving voltage line VDL along the third direction (z-axis direction).

In addition, the second thickness T2 of the second interlayer dielectric layer 142 overlapping with the driving voltage line VDL along the third direction (z-axis direction) (FIG. 10) may be smaller than the second thickness T2 of the second interlayer dielectric layer 142 overlapping with the second sub-power supply line SPSL2 along the third direction (z-axis direction) (FIG. 9).

In addition, the third thickness T3 of the second interlayer dielectric layer 142 not overlapping with the driving voltage line VDL along the third direction (z-axis direction) (FIG. 10) may be substantially equal to the third thickness T3 of the second interlayer dielectric layer 142 not overlapping with the second sub-power supply line SPSL2 along the third direction (z-axis direction) (FIG. 9).

In embodiments of the display device 10, a first power supply line PSL1 of may have a two-layer wiring structure including a first sub-power supply line SPSL1 and a second sub-power supply line SPSL2. Thus, even though the width of the first power supply line PSL1 is reduced as the planar area of the non-display area NDA of the display device 10 decreases, increasing of an electrical resistance of the first power supply line PSL1 is reduced or effectively prevented. Therefore, deviations in electrical resistance between the driving voltage lines VDL connected to the first power supply line PSL1 may be reduced or effectively prevented. Accordingly, non-uniformity of the luminance of the pixels of the display device 10 may be suppressed or effectively prevented.

The invention should not be construed as being limited to the embodiments set forth herein. Rather, these embodiments are provided so that this invention will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
 a substrate comprising a display area and a non-display area which is adjacent to the display area;
 a first power supply line which is in the non-display area and through which a first supply voltage is provided to the display area; and
 a driving voltage line which is in the display area and electrically connects the first power supply line to the display area,
 wherein
 the first power supply line comprises:
  a first sub-power supply line in the non-display area; and
  a second sub-power supply line which is in the non-display area and faces the first sub-power supply line along a thickness direction of the substrate, and
 the second sub-power supply line and the driving voltage line are respective patterns of a same material layer on the substrate.

2. The display device of claim 1, wherein the second sub-power supply line extends further than the first sub-power supply line to define an extended portion of the second sub-power supply line, and
 the extended portion of the second sub-power supply line includes the driving voltage line.

3. The display device of claim 1, wherein within the first power supply line, the second sub-power supply line contacts the first sub-power supply line.

4. The display device of claim 1, wherein
the driving voltage line extends from the first power supply line along a first direction,
each of the first sub-power supply line and the second sub-power supply line has a width along the first direction, and
the width of the second sub-power supply line is greater than the width of the first sub-power supply line.

5. The display device of claim 1, further comprising an insulating layer between the substrate and the first sub-power supply line,
wherein
the first sub-power supply line is between the substrate and the second sub-power supply line along the thickness direction of the substrate, and
the insulating layer extends from the first sub-power supply line to be between the substrate and the driving voltage line.

6. The display device of claim 5, wherein along the thickness direction of the substrate:
the insulating layer has a thickness corresponding to the first sub-power supply line and a thickness corresponding to the driving voltage line, and
the thickness of the insulating layer which corresponds to the first sub-power supply line is greater than the thickness of the insulating layer which corresponds to the driving voltage line.

7. The display device of claim 6, wherein a difference between the thickness of the insulating layer which corresponds to the first sub-power supply line and the thickness of the insulating layer which corresponds to the driving voltage line ranges from about 700 Å to about 1,200 Å.

8. The display device of claim 5, wherein
the second sub-power supply line extends further than the first sub-power supply line to define an extended portion of the second sub-power supply line, and
along the thickness direction of the substrate:
the insulating layer has a thickness corresponding to the first sub-power supply line and a thickness corresponding to the extended portion of the second sub-power supply line, and
the thickness of the insulating layer which corresponds to the first sub-power supply line is greater than the thickness of the insulating layer which corresponds to the extended portion of the second sub-power supply line.

9. The display device of claim 1, further comprising in the non-display area:
a plurality of display pads through which an electrical signal is provided to the display device from outside thereof, the plurality of display pads including a first display pad and a second display pad;
a power supply bridge connected to the first power supply line; and
a first power supply pad line which connects the first display pad to the power supply bridge.

10. The display device of claim 9, further comprising a planarization layer between the power supply bridge and the first power supply line and between the power supply bridge and the first power supply pad line.

11. The display device of claim 10, further comprising a first power connection contact hole which is in the planarization layer and exposes the second sub-power supply line outside the planarization layer,
wherein the power supply bridge is connected to the second sub-power supply line through the first power connection contact hole in the planarization layer.

12. The display device of claim 10, wherein
the first power supply pad line comprises:
a first sub-power supply pad line in the non-display area; and
a second sub-power supply pad line which is in the non-display area and faces the first sub-power supply pad line along the thickness direction of the substrate, and
the second sub-power supply pad line and the driving voltage line are respective patterns of a same material layer on the substrate.

13. The display device of claim 12, wherein within the non-display area:
the first power supply line, the power supply bridge and the first power supply pad line are arranged along a first direction,
each of the first sub-power supply pad line and the second sub-power supply pad line has a width along a second direction crossing the first direction, and
the width of the second sub-power supply pad line is greater than the width of the first sub-power supply pad line.

14. The display device of claim 12, further comprising a second power connection contact hole which is in the planarization layer and exposes the second sub-power supply pad line outside the planarization layer,
wherein the power supply bridge is connected to the second sub-power supply pad line through the second power connection contact hole in the planarization layer.

15. The display device of claim 10, further comprising a light-emitting element in the display area, the light-emitting element comprising a first electrode, an emissive layer and a second electrode in order from the substrate,
wherein the power supply bridge and the first electrode are respective patterns of a same material layer on the substrate.

16. The display device of claim 9, further comprising:
in the display area, a plurality of data lines, and
in the non-display area, a demux transistor which connects the second display pad to the plurality of data lines,
wherein the power supply bridge corresponds to the demux transistor along the thickness direction of the substrate.

17. The display device of claim 16, further comprising:
a common electrode which is in the display area, and
a second power supply line which is in the non-display area and through which a second supply voltage different from the first supply voltage is provided to the common electrode.

18. A display device comprising:
a substrate comprising a display area and a non-display area which is adjacent to the display area;
a first power supply line which is in the non-display area through which a supply voltage is provided to the display area, wherein the first power supply line comprises:
a first sub-power supply line in the non-display area; and
a second sub-power supply line which is in the non-display area and faces the first sub-power supply line along a thickness direction of the substrate,
a driving voltage line which is in the display area and electrically connects the first power supply line to the display area; and an insulating layer which is between the substrate and the first sub-power supply line, wherein the insulating layer extends from the first sub-power supply line to be between the substrate and the driving voltage line, and along the thickness direction of the substrate:
- the insulating layer has a thickness corresponding to the first sub-power supply line and a thickness corresponding to the driving voltage line, and
- the thickness of the insulating layer which corresponds to the first sub-power supply line is greater than the thickness of the insulating layer which corresponds to the driving voltage line.

19. The display device of claim 18, wherein the first sub-power supply line is between the substrate and the second sub-power supply line along the thickness direction of the substrate, and a difference between the thickness of the insulating layer which corresponds to the first sub-power supply line and the thickness of the insulating layer which corresponds to the driving voltage line ranges from about 700 Å to about 1,200 Å.

20. The display device of claim 18, wherein the first sub-power supply line is between the substrate and the second sub-power supply line along the thickness direction of the substrate, the second sub-power supply line extends further than the first sub-power supply line to define an extended portion of the second sub-power supply line, and along the thickness direction of the substrate:
- the insulating layer has a thickness corresponding to the first sub-power supply line and a thickness corresponding to the extended portion of the second sub-power supply line, and
- the thickness of the insulating layer which corresponds to the first sub-power supply line is greater than the thickness of the insulating layer which corresponds to the extended portion of the second sub-power supply line.

21. The display device of claim 18, wherein the second sub-power supply line and the driving voltage line are respective patterns of a same material layer on the substrate.

22. The display device of claim 21, wherein the first sub-power supply line contacts the second sub-power supply line.

* * * * *